United States Patent
Nakamura et al.

(10) Patent No.: US 7,109,651 B2
(45) Date of Patent: Sep. 19, 2006

(54) ORGANIC ELECTROLUMINESCENCE CELL, PLANAR LIGHT SOURCE AND DISPLAY DEVICE

(75) Inventors: Toshitaka Nakamura, Ibaraki (JP); Minoru Miyatake, Ibaraki (JP); Shusaku Nakano, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/721,269

(22) Filed: Nov. 26, 2003

(65) Prior Publication Data

US 2004/0195962 A1    Oct. 7, 2004

(30) Foreign Application Priority Data

| Nov. 26, 2002 | (JP) | ............................ P2002-341821 |
| Jan. 6, 2003 | (JP) | ............................ P2003-000080 |
| Mar. 7, 2003 | (JP) | ............................ P2003-062554 |
| Jul. 28, 2003 | (JP) | ............................ P2003-280576 |

(51) Int. Cl.
*H01J 1/62* (2006.01)
*H01J 5/16* (2006.01)

(52) U.S. Cl. ..................................... 313/504; 313/110

(58) Field of Classification Search ............... 313/504, 313/506, 509, 110–112; 428/690
See application file for complete search history.

(56) References Cited

U.S. PATENT DOCUMENTS

| 6,091,384 | A | * | 7/2000 | Kubota et al. ................. 345/76 |
| 6,476,550 | B1 | * | 11/2002 | Oda et al. ..................... 313/504 |
| 6,507,379 | B1 | * | 1/2003 | Yokoyama et al. ............ 349/69 |
| 6,607,277 | B1 | * | 8/2003 | Yokoyama et al. ............ 353/52 |
| 6,617,784 | B1 | * | 9/2003 | Abe et al. ..................... 313/506 |
| 6,630,684 | B1 | * | 10/2003 | Lee et al. ..................... 257/40 |
| 6,724,140 | B1 | * | 4/2004 | Araki ........................... 313/504 |
| 6,828,042 | B1 | * | 12/2004 | Imanishi ...................... 428/690 |
| 6,831,409 | B1 | * | 12/2004 | Yamada ....................... 313/506 |
| 2003/0122481 | A1 | * | 7/2003 | Song et al. .................. 313/506 |
| 2004/0012980 | A1 | * | 1/2004 | Sugiura et al. ............. 362/560 |
| 2004/0145303 | A1 | * | 7/2004 | Yamada et al. ............. 313/504 |
| 2004/0212296 | A1 | * | 10/2004 | Nakamura et al. .......... 313/504 |
| 2004/0263045 | A1 | * | 12/2004 | Smith et al. ................. 313/373 |
| 2005/0099113 | A1 | * | 5/2005 | Yamada ....................... 313/504 |

FOREIGN PATENT DOCUMENTS

| JP | 63-314795 A | 12/1988 |
| JP | 4-268505 A | 9/1992 |

(Continued)

OTHER PUBLICATIONS

Takuya Ogawa, et al. (IEICE Trans Electron) vol. E-85-C, No. 6, p. 1239, 2002.

(Continued)

*Primary Examiner*—Karabi Guharay
*Assistant Examiner*—Dalei Dong
(74) *Attorney, Agent, or Firm*—Sughrue Mion, PLLC

(57) ABSTRACT

An organic electroluminescence cell including at least one organic layer and a pair of electrodes, the organic layer including a light-emitting layer and sandwiched between the pair of electrodes, the pair of electrodes including a reflective electrode and a transparent electrode, the organic electroluminescence cell formed to satisfy the expression: $B_0 < B_\theta$ in which $B_0$ is a frontal luminance value of luminescence radiated from a light extraction surface to an observer, and $B_\theta$ is a luminance value of the luminescence at an angle of from 50° to 70°, wherein a reflection/refraction angle disturbance region is provided so that the angle of reflection/refraction of the luminescence is disturbed while the luminescence is output from the light-emitting layer to the observer side through the transparent electrode.

16 Claims, 5 Drawing Sheets

FOREIGN PATENT DOCUMENTS

| | | |
|---|---|---|
| JP | 5-3081 A | 1/1993 |
| JP | 6-151061 A | 5/1994 |
| JP | 6-347617 A | 12/1994 |
| JP | 8-271892 A | 10/1996 |
| JP | 9-506984 A | 7/1997 |
| JP | 9-507308 A | 7/1997 |
| JP | 10-321371 A | 12/1998 |
| JP | 11-214162 A | 8/1999 |
| JP | 11-214163 A | 8/1999 |
| JP | 11-231132 A | 8/1999 |
| JP | 11-283751 A | 10/1999 |
| JP | 11-316376 A | 11/1999 |
| JP | 2000-182774 A | 6/2000 |
| JP | 2001-203074 A | 7/2001 |
| JP | 2001-244080 A | 9/2001 |
| JP | 2001-311826 A | 11/2001 |
| JP | 2001-313178 A | 11/2001 |
| JP | 2001-356027 A | 12/2001 |

OTHER PUBLICATIONS

M.H. Lu, et al. (J. Appl. Phys., vol. 91, No. 2, p. 595, 2002).
J. McElvain, et al. (J. Appl. Phys. vol. 80, No.10, p. 6002, 1996).
Asuka et al. (Appl. Phy. Lett., vol. 78, p. 3343, 2001).
Matsumura, et al. (Appl. Phy. Lett., vol. 79, p. 4491, 2001.
Matsumoto [OPTRONICS] No. 2, p. 136, 2003.

* cited by examiner

ORGANIC ELECTROLUMINESCENCE CELL, PLANAR LIGHT SOURCE AND DISPLAY DEVICE

The present application is based on Japanese Patent Applications Nos. 2002-341821, 2003-000080, 2003-062554 and 2003-280576, which are incorporated herein by reference.

BACKGROUND OF THE INVENTION

1. Field of the Invention

The present invention relates to an organic electroluminescence cell excellent in light-emitting efficiency and especially excellent in efficiency of extracting luminescence to the outside, a (polarizing-type) planar light source of high efficiency using the organic electroluminescence cell, and a (liquid crystal) display device having the planar light source.

2. Description of the Related Art

An electroluminescence cell or a light-emitting diode in which a light-emitting layer is provided between electrodes to obtain luminescence electrically has been researched and developed actively not only for application to a display device but also for application to various types of light sources such as a flat illuminator, a light source for optical fiber, a backlight unit for liquid crystal display, a backlight unit for liquid crystal projector, etc.

Particularly, an organic electroluminescence cell has attracted public attention in recent years because it is excellent in light-emitting efficiency, low-voltage drive, light-weight and low cost. A primary concern with the purpose of application to these light sources is enhancement in light-emitting efficiency. Improvement in cell structure, material, drive method, production method, etc. has been examined to obtain light-emitting efficiency equivalent to that of a fluorescent lamp.

In an inter-solid luminescent element such as an organic electroluminescence cell in which luminescence is extracted from a light-emitting layer per se, however, light generated at a angle not lower than a critical angle decided on the basis of the refractive index of the light-emitting layer and the refractive index of an output medium is totally reflected and confined in the inside, so that the light is lost as guided light.

According to calculation based on classical law of refraction (Snell's law), light-extracting efficiency $\eta$ in taking out generated light to the outside can be given by the approximate expression $\eta=1/(2n^2)$ in which n is the refractive index of the light-emitting layer. Assuming that the refractive index of the light-emitting layer is 1.7, then 80% or more of the light is lost as guided light, that is, as a loss in a side face direction of the cell because $\eta$ is nearly equal to 17%.

In the organic electroluminescence cell, excitons contributing to luminescence are only singlet excitons among excitons generated by recombination of electrons and holes injected from the electrodes. The probability that singlet excitons will be generated is ¼. Even in the case where only such a thing is taken into consideration, the efficiency is not higher than 5%, that is, the efficiency is very low.

As a method for improving the light-emitting efficiency of the light-emitting layer per se, development of a luminescent material (Unexamined Japanese Patent Publication No. 2001-313178) for generating light also from phosphorescence due to triplet excitons has advanced in recent years, so that the possibility that quantum efficiency will be improved remarkably has been found.

Even if quantum efficiency were improved, light-emitting efficiency would be reduced in accordance with light-extracting efficiency multiplied by the quantum efficiency. In other words, if light-extracting efficiency can be improved, there is room for remarkable improvement in light-emitting efficiency according to the synergy between the quantum efficiency and the light-extracting efficiency.

As described above, in order to extract guided light to the outside, a region for disturbing an angle of reflection/refraction need to be formed between the light-emitting layer and an emergence surface to destroy Snell's law to thereby change an angle of transmission of light originally totally reflected as guided light or beam-condensing characteristic need to be given to luminescence per se. It is however not easy to form such a region that outputs all guided light to the outside. Therefore, a proposal for taking out guided light as much as possible has been made.

For example, as methods for improving light-extracting efficiency, there have been proposed a method in which beam-condensing characteristic is given to a substrate per se to improve light-extracting efficiency (Unexamined Japanese Patent Publication No. Sho. 63-314795), a method in which a light-emitting layer is made of discotic liquid crystal to improve frontal directivity of generated light per se (Unexamined Japanese Patent Publication No. Hei. 10-321371) and a method in which a stereostructure, an inclined surface, a diffraction grating, etc. are formed in the cell per se (Unexamined Japanese Patent Publication No. Hei. 11-214162, Unexamined Japanese Patent Publication No. Hei. 11-214163 and Unexamined Japanese Patent Publication No. Hei. 11-283751). These proposals, however, have a problem on complication in structure, reduction in light-emitting efficiency of the light-emitting layer per se, etc.

As a relatively simple method, there has been also proposed a method in which a light-diffusing layer is formed to change an angle of refraction of light to thereby reduce light satisfying the condition of total-reflection.

For example, there have been proposed various methods such as a method using a diffusing plate having a transparent substrate, and particles-dispersed in the transparent substrate so as to form such a distributed index structure that the refractive index of the inside is different from the refractive index of the outside (Unexamined Japanese Patent Publication No. Hei. 6-347617), a method in which a diffusing member having a light-transmissive substrate, and a single particle layer arranged on the light-transmissive substrate (Unexamined Japanese Patent Publication No. 2001-356207) are used, and a method in which scattering particles are dispersed in the same material as that of the light-emitting layer (Unexamined Japanese Patent Publication No. Hei.6-151061). These proposals have been provided by finding features in the characteristic of scattering particles, the refractive index difference from a dispersion matrix, the dispersing form of particles, the place for formation of the scattering layer, and so on.

Incidentally, the organic electroluminescence cell uses such a principle that holes injected from the anode and electrons injected from the cathode by application of an electric field are recombined into excitons to generate luminescence from a fluorescent (or phosphorescent) substance. It is therefore necessary to perform the recombination efficiently in order to improve quantum efficiency. As this method, there is generally used a method in which the cell is formed as a laminated structure. For example, a two-layer structure having a hole transport layer and an electron transport light-emitting layer or a three-layer structure having a hole transport layer, a light-emitting layer and an electron transport layer is used as the laminated structure.

There have been also made various proposals for a laminated cell formed as a double hetero structure in order to improve efficiency.

In such a laminated structure, recombination is substantially concentrated in a certain region. For example, in a two-layer type organic electroluminescence cell, as shown in FIG. 12, recombination is concentrated in an electron transport light-emitting layer side region 6 which is about 10 nm distant from an interfacial layer between a hole transport layer 4 and an electron transport light-emitting layer 5 which are sandwiched between a pair of electrodes constituted by a reflective electrode 3 and a transparent electrode 2 (as reported by Takuya, Ogawa et al, "IEICE TRANS ELECTRON" Vol. E85-C, No. 6, p. 1239, 2002).

Light generated in the light-emitting region 6 is radiated in all directions. Consequently, as shown in FIG. 13, an optical path difference is produced between light radiated toward a light-extracting surface on the transparent electrode 2 side and light radiated toward the reflective electrode 3, reflected by the reflective electrode 3 and radiated toward the light-extracting surface.

In FIG. 13, the thickness of the electron transport light-emitting layer in the organic electroluminescence cell is generally in a range of from tens of nm to a hundred and tens of nm, that is, the order of wavelength of visible light. Accordingly, light beams finally outgoing from the cell interfere with each other. The interference becomes destructive or constructive according to the distance d between the light-emitting region and the reflective electrode. Although only light radiated in a frontal direction is shown in FIG. 13, light radiated in oblique directions is also present actually. The condition of interference varies according to the angle of radiated light in addition to the distance d and the wavelength λ of generated light. As a result, there may occur the case where light beams radiated in a frontal direction interfere with each other constructively but light beams radiated in a wide-angle direction interfere with each other destructively, or there may occur the case reverse to the aforementioned case. That is, luminance of generated light varies according to the viewing angle.

It is a matter of course that the intensity of light varies remarkably according to the angle as the distance d increases. Therefore, the thickness of the electron transport light-emitting layer is generally selected so that the distance d is made equal to about a quarter of the wavelength of generated light to obtain constructive interference of light in the frontal direction.

When, for example, the distance d is smaller than about 50 nm, absorption of light becomes remarkable in the reflective electrode generally made of a metal. This causes reduction in intensity of generated light and influence on intensity distribution. That is, in the organic electroluminescence cell, the distribution of radiated light varies remarkably according to the distance d between the light-emitting region and the reflective electrode, so that the guided light component varies widely according to the variation in the distribution of radiated light. Furthermore, the emission spectrum of this type cell has broad characteristic in a relatively wide wavelength range. Accordingly, variation in the wavelength range for constructive interference of light according to the distance d causes variation in peak wavelength of generated light. Furthermore, the emission spectrum varies according to the viewing angle in addition to the distance d.

To solve these problems, there has been made a proposal for selecting the film thickness to suppress a phenomenon that the color of generated light varies according to the viewing angle (see Patent Document 1). In this proposal, however, there is no description concerning guided light. It is obvious that the film thickness range selected by this proposal for suppressing the dependence of the color of generated light on the viewing angle is different from the range according to the invention which will be described later.

For the aforementioned reason, the light-extracting efficiency of the laminated organic electroluminescence cell cannot be calculated correctly on the classical assumption that about 80% of generated light is confined as guided light in the inside of the cell. That is, the guided light component varies remarkably according to the structure of the cell. For example, as reported by M. H. Lu et al. (J. Appl. Phys., Vol. 91, No. 2, p. 595, 2002), detailed research on change in the guided light component according to the structure of the cell has been made on the basis of a quantum-mechanical calculation method in consideration of a micro-cavity effect.

Accordingly, there is a possibility that the obtained effect will not be so large as estimated by the classical theory even in the case where a light-diffusing layer or the like is formed in order to destroy the condition of total reflection.

When the organic electroluminescence cell is used as a backlight unit for a liquid crystal display device, luminescence generated from the cell needs to be converted into linearly polarized light by a polarizer when used for liquid crystal display because the luminescence is natural light. As a result, absorption loss due to the polarizer is produced. There is a problem that the rate of utilization of light cannot be set to be higher than 50%. Hence, even in the case where guided light is extracted efficiently by the aforementioned method, a half or more of the guided light is absorbed to the polarizer.

As a method for solving the problem, there has been made a proposal for forming an organic electroluminescence cell layer on an oriented film to extract luminescence per se as linearly polarized light (see Patent Document 2). Although the absorption loss due to the polarizer can be reduced to half, at the most, by the aforementioned proposal, there is a possibility that the light-emitting efficiency of the cell will be lowered because of the insertion of the oriented film for orienting an organic thin film. In addition, like the related-art cell, the problem of the guided light due to total reflection cannot be solved at all by this proposal.

It has been proposed a method in which light generated in an organic electroluminescence cell is extracted through a polarizing/scattering film (see Patent Document 3). According to this proposal, light lost as guided light can be scattered so as to be extracted, and output light can be extracted as polarized light which is rich in linearly polarized light. Accordingly, the absorption loss due to the polarizer can be reduced, so that a polarizing-type planar light source of high efficiency can be provided as a light source for a liquid crystal display device.

For example, the relation between the guided light and the influence of the distance between the light-emitting region and the reflective electrode on interference has not been described yet in this proposal. It cannot be said that this proposal brings out the greatest possible effect of the light source for a liquid crystal display device.

As a method for reducing absorption loss of backlight due to a polarizer in a liquid crystal display device, there is known a method using a polarized light separating layer made of a reflection type polarizing element (see Patent Documents 4 and 5). There has been made a proposal for applying this method to an organic electroluminescence cell (see Patent Documents 6 and 7).

No proposal has ever been made for bringing out the greatest light-emitting efficiency, for example, by combination of an organic electroluminescence cell and a reflection type circular polarizing element on the assumption of detailed research on the relation between the guided light and the influence of the distance between the light-emitting region and the reflective electrode on interference in the organic electroluminescence cell. Therefore, the provision of a polarizing-type planar light source of high efficiency best adapted to a liquid crystal display device using polarized light is desired earnestly in the existing circumstances.

[Patent Document 1]
Unexamined Japanese Patent Publication No. Hei. 5-3081 (pages 2 to 4)

[Patent Document 2]
Unexamined Japanese Patent Publication No. Hei. 11-316376 (pages 2 to 5)

[Patent Document 3]
Unexamined Japanese Patent Publication No. 2001-203074 (pages 2 to 6)

[Patent Document 4]
Unexamined Japanese Patent Publication No. Hei. 4-268505 (pages 2 to 6)

[Patent Document 5]
Unexamined Japanese Patent Publication No. Hei. 8-271892 (pages 2 to 5)

[Patent Document 6]
Unexamined Japanese Patent Publication No. 2001-244080 (pages 2 to 4)

[Patent Document 7]
Unexamined Japanese Patent Publication No. 2001-311826 (pages 2 and 3)

SUMMARY OF THE INVENTION

Under such circumstances, an object of the invention is to provide an organic electroluminescence cell which is so excellent in light-extracting efficiency that loss light confined as guided light in the inside of the organic electroluminescence cell in the related art can be extracted efficiently. Another object of the invention is to provide an organic electroluminescence cell of high efficiency in which: the loss light can be extracted as polarized light efficiently when the cell is used as a backlight unit for a liquid crystal display device; and absorption due to a polarizer can be minimized. A further object of the invention is to provide a planar light source or a polarizing-type planar light source of high efficiency using the organic electroluminescence cell, and a display device such as a liquid crystal display device having the planar light source or the polarizing-type planar light source.

The inventors have made examination earnestly to solve the problem. As a result, the following knowledge has been obtained. The knowledge will be described with reference to FIG. 9. FIG. 9 is a schematic view showing the case where light generated in the light-emitting region 6 of the two-layer type organic electroluminescence cell depicted in FIG. 12 is extracted from the cell. Although only light radiated toward an upper semispherical surface is shown in FIG. 9, light radiated toward the reflective electrode 3 is not shown in FIG. 9 but actually present.

In FIG. 9, the critical angle decided on the basis of the difference between the refractive index of a support substrate (glass substrate) 1 and the refractive index of an air layer is about 40 degrees. That is, light having an angle greater than 40 degrees is totally reflected by the glass/air interface so as to be confined as guided light in the inside of the cell. Although about 45% of light calculated by 40 degrees per 90 degrees appears to be extracted from the cell in FIG. 9, actually generated light is radiated in all directions. For this reason, solid angles are decided so that the intensity of a light component becomes higher as the angle of the light component becomes wider. For this reason, the light-emitting efficiency calculated according to the classical theory is not higher than 20%.

Actually, the organic electroluminescence cell causes an effect of interference of light. For the interference of light, the structure of the cell is usually decided so that light beams radiated in a frontal direction so as to be able to be extracted from the cell interfere with each other constructively. In this case, guided light beams interfere with each other destructively rather than constructively. Accordingly, even in the case where a region for disturbing an angle of reflection/refraction is provided in the structure of the cell, a large luminance-improving effect cannot be expected.

On the other hand, the inventors have tried forming a region for disturbing an angle of reflection/refraction in addition to amplifying guided light having a large part of light intensity distributed therein by deciding the structure of the cell intentionally to obtain destructive interference of light radiated in the frontal direction and constructive interference of the wide-angle light component usually confined as guided light in the inside of the cell. As a result, it has been found that light-emitting efficiency is improved remarkably compared with the related-art method. That is, it has been found that an organic electroluminescence cell obtained when a region for disturbing an angle of reflection/refraction is provided in a cell structure which is formed without the region so as to exhibit low light-emitting efficiency is higher in efficiency than that obtained when the region is provided in the related-art cell structure.

It has been also found that a polarizing-type planar light source and a liquid crystal display device which are so high in efficiency that absorption due to a polarizer can be minimized are obtained by using a reflection type polarizing element for reducing light absorbed to the polarizer when the organic electroluminescence cell configured as described above is applied to a backlight unit for a liquid crystal display device.

The inventors have further found that guided light confined in the inside of the cell can be extracted as polarized light efficiently without necessity of use of the reflection type polarizing element particularly when a polarizing/scattering site containing a light-transmissive resin, and micro domains different in birefringence characteristic from the light-transmissive resin and dispersed/distributed into the light-transmissive resin is provided as the region for disturbing the angle of reflection/refraction. That is, in the organic electroluminescence cell shown in FIG. 9, the state in which light generated in the light-emitting region 6 is extracted from the cell is examined in the condition that a polarizing/scattering site containing a light-transmissive resin, and micro domains different in birefringence characteristic from the light-transmissive resin and dispersed/distributed into the light-transmissive resin is formed on a light-extracting surface side on the support substrate (glass substrate) 1, that is, on a side opposite to the transparent electrode 2, substantially without interposition of any air layer.

Among generated light, light present in the upper hemisphere of FIG. 9 passes through the transparent electrode and the glass substrate and is made incident on the polarizing/scattering site. Light present in the lower sphere of FIG. 9 is reflected by the cathode and then also made incident on the polarizing/scattering site. In this process, generated light can be made incident on the polarizing/scattering site without influence of total reflection because there is no air layer (refractive index=1) low in refractive index (Incidentally, depending on the refractive indices of the transparent electrode and the glass substrate, part of light may be totally reflected). As shown in FIG. 9, in the general cell, light having an angle not smaller than the critical angle decided on the basis of the difference between the refractive index of the glass substrate and the refractive index of the air layer is totally reflected so as to be lost as guided light, so that only about 20%, at the most, of the generated light can be extracted from the cell.

Large part of the generated light incident on the polarizing/scattering site without influence of total reflection is totally reflected because of the refractive index difference between the polarizing/scattering site and the air interface and propagated through the polarizing/scattering site. In the propagated light, a linearly polarized light component having a plane of vibration parallel to an axial direction ($\Delta n_1$ direction) exhibiting the maximum refractive index difference ($\Delta n_1$) between the micro domains and other regions in the polarizing/scattering site is selectively intensively scattered. As a result, the angle of part of the propagated light becomes smaller than the angle of total reflection, so that part of the propagated light emerges from the cell to the outside (air). Incidentally, if there is no micro domain so that selective polarized scattering does not occur, about 80% of the generated light judged from solid angles is confined in the inside of the cell while total reflection is repeated. The confined light can emerge from the cell to the outside only when the condition of total reflection is destroyed by scattering in the interface between each micro domain and the light-transmissive resin. Accordingly, the light-extracting efficiency can be controlled optionally on the basis of the size of each micro domain and the degree of presence of the micro domains.

On the other hand, light beams scattered at large angles at the time of scattering in the $\Delta n_1$ direction, light beams satisfying the condition of the $\Delta n_1$ direction but not scattered and light beams having other directions of vibration than the $\Delta n_1$ direction are confined in the polarizing/scattering site and propagated through the polarizing/scattering site while total reflection is repeated. These confined light beams wait for a change to emerge from the polarizing/scattering site by satisfying the condition of the $\Delta n_1$ direction in such a manner that the polarized state is eliminated by birefringence retardation or the like. By the repetition of the aforementioned operation, linearly polarized light having a predetermined plane of vibration can emerge from the polarizing/scattering site efficiently. That is, light origin ally confined as guided light can be finally extracted as a linearly polarized light component. Hence, according to this method, generated light can be extracted, as polarized light rich in its linearly polarized light component, from the cell efficiently without provision of any special light output means such as microlenses or reflecting dots. In addition, the direction of vibration of linearly polarized light can be changed optionally by the angle at which the polarizing/scattering site is set. Accordingly, when the organic electroluminescence cell is used as a backlight unit for a liquid crystal display device, electric power consumption can be reduced.

As described above, it has been found that light-emitting efficiency can be improved compared with the related art method when the polarizing/scattering site is integrally formed without interposition of any air layer in addition to amplifying wide-angle light having a large part of light intensity distributed therein in accordance with solid angles by deciding the structure of the cell intentionally to obtain destructive interference of light radiated in the frontal direction and constructive interference of the wide-angle light component usually confined as guided light in the inside of the cell. That is, when such a cell structure that will make light-emitting efficiency low in ordinary use of the cell is combined with the polarizing/scattering site, generated light can be efficiently extracted from the cell and as polarized light rich in its linearly polarized light component. When the organic electroluminescence cell finally obtained is used as a backlight unit for a liquid crystal display device, light-emitting efficiency can be improved remarkably.

The biggest weakness of the organic electroluminescence cell is that the cell deteriorates on contact with a small amount of moisture or oxygen. For this reason, there is a problem that dark spots are produced with fine defects as start points, to say nothing of reaction in light-emitting efficiency. Such dark spots have been described in detail as reported by J. McElvain et al. (J. Appl. Phys., Vol. 80, No. 10, p. 6002, 1996). Although the cell is generally perfectly sealed in order to avoid this problem, it is still difficult to prevent the production of dark spots perfectly. The dark spots remarkably reduce the external appearance and visibility of a planar light source or a display device.

When the polarizing/scattering site is formed in the aforementioned manner, there can be however obtained such a vary excellent effect that lowering of visibility caused by the production of dark spots becomes almost inconspicuous even if the dark spots were more or less produced, because light finally extracted toward the observer side is light emerging from the cell after repeatedly scattered in the polarizing/scattering site.

The invention is accomplished on the basis of the aforementioned knowledge.

That is, the invention provides an organic electroluminescence cell (hereinafter merely referred to as organic EL cell) including at least one organic layer, and a pair of electrodes serving as an anode and a cathode respectively, the organic layer having a light-emitting layer and being sandwiched between the pair of electrodes, at least one of the pair of electrodes being provided as a transparent electrode, the organic EL cell being formed to satisfy the expression (1); $B_0 < B_\theta$ in which $B_0$ is a frontal luminance value of luminescence radiated from a light extraction surface to an observer, and $B_\theta$ is a luminance value of the luminescence at an angle of from 50° to 70°, wherein a reflection/refraction angle disturbance region is provided substantially without interposition of any air layer so that the angle of reflection/refraction of the luminescence is disturbed while the luminescence is output from the light-emitting layer to the observer side through the transparent electrode.

That is, the organic electroluminescence cell according to the present invention comprising:

at least one organic layer;

and a pair of electrodes serving as an anode and a cathode respectively;

the organic layer including a light-emitting layer and being sandwiched between the pair of electrodes, at least one of the pair of electrodes being provided as a transparent electrode, the organic electroluminescence cell being formed to satisfy the expression (1): $B_0 < B_\theta$ in which to is a frontal luminance-value of luminescence radiated from a light extraction surface to an observer, and $B_\theta$ is a luminance value of the luminescence at an angle of from 50° to 70°; and a reflection/refraction angle disturbance region being provided substantially without interposition of any air layer so that the angle of reflection/refraction of the luminescence is disturbed while the luminescence is output from the light-emitting layer to the observer through the transparent electrode.

In an especially preferred mode of the organic EL cell configured according to the invention, one of the anode and the cathode is a transparent electrode and the other is a reflective electrode; and the organic EL cell satisfies the expression (2): $(0.3/n)\lambda < d < (0.5/n)$ in which d (nm) is a distance between an approximate center portion of a hole-electron recombination light-emitting, region and the reflective electrode, $\lambda$ (nm) is a peak wavelength of a fluorescence spectrum of a material used in the light-emitting layer, and n is a refractive index of the organic layer between the light-emitting layer and the reflective electrode.

Preferably, in the organic EL cell configured according to the invention, the reflection/refraction angle disturbance region may be constituted by a light-diffusing site which contains a transparent material, and a transparent or opaque material different in refractive index from the transparent material and dispersed/distributed in the transparent material, or the reflection/refraction angle disturbance region may be constituted by a lens structure or by a protruded and grooved face.

The invention also provides a planar light source including an organic EL cell having any one of the aforementioned configurations or a display device including the planar light source.

Preferably, the organic EL cell configured according to the invention further includes a reflection type polarizing element provided on the observer side viewed from the reflection/refraction angle disturbance region. Particularly, in the organic EL cell, the reflection type polarizing element maybe a reflection type circular polarizing element made of a cholesteric liquid crystal layer or the reflection type polarizing element may be a reflection type linear polarizing element made of a multilayer laminate of at least two materials different in refractive index. Preferably, the organic EL cell configured according to the invention further includes an optically compensating layer which has no anisotropy in in-plane refractive index and in which a refractive index in a direction of thickness is higher than the in-plane refractive index.

The invention also provides a polarizing-type planar light source including an organic EL cell having any one of the aforementioned configurations or a display device such as a liquid crystal display device including the polarizing-type planar light source.

Preferably, in the organic EL cell configured according to the invention, the reflection/refraction angle disturbance region is constituted by a polarizing/scattering site which contains a light-transmissive resin, and micro domains different in birefringence characteristic from the light-transmissive resin and dispersed/distributed in the light-transmissive resin. Particularly, in the organic EL cell, the micro domains in the polarizing/scattering site maybe made of one member selected from the group consisting of a liquid crystal material, a vitrified material with a liquid crystal phase supercooled and solidified, and a material with a liquid crystal phase of polymerizable liquid crystal crosslinked and fixed by an energy beam or the polarizing/scattering site may contain a light-transmissive resin, and micro domains which are made of a liquid crystal polymer having a glass transition temperature of not lower than 50° C. to exhibit a nematic liquid crystal phase at a lower temperature than the glass transition temperature of the light-transmissive resin and which are dispersed in the light-transmissive resin. Preferably, in the organic EL cell configured according to the invention, the polarizing/scattering site exhibits refractive index differences $\Delta n_1$, $\Delta n_2$ and $\Delta n_3$ between the micro domains and the other portions in directions of respective optical axes of the micro domains; and the refractive index difference $\Delta n_1$ in an axial direction ($\Delta n_1$ direction) as the highest one of the refractive index differences $\Delta n_1$, $\Delta n_2$ and $\Delta n_3$ is in a range of from 0.03 to 0.5 whereas each of the refractive index differences $\Delta n_2$ and $\Delta n_3$ in two axial directions ($\Delta n_2$ direction and $\Delta n_3$ direction) perpendicular to the $\Delta n_1$ direction is not larger than 0.03.

The invention also provides a polarizing-type planar light source including an organic EL cell having any one of the aforementioned configurations or a display device such as a liquid crystal display device including the polarizing-type planar light source.

According to the invention, light-emitting efficiency is low before formation of a reflection/refraction angle disturbance region but the reflection/refraction angle disturbance region is formed to amplify a guided light component originally confined in the inside of the cell to thereby disturb the angle of reflection/refraction of the guided light component to thereby extract the guided light component. Accordingly, the intensity of light finally extracted can be increased, so that an organic EL cell of high efficiency can be provided.

Further, a polarizing/scattering site is formed as the reflection/refraction angle disturbance region to make it possible not only to increase the intensity of light emerging from the cell but also to extract the light as polarized light rich in its linearly polarized light component. Accordingly, the organic EL cell can be provided as a cell that exhibits very high efficiency when the cell is applied to a polarizing-type planar light source used in a liquid crystal display device.

A reflection type polarizing element may be further set, in addition to formation of a light-diffusing layer, a lens structure or the like, as the reflection/refraction angle disturbance region. In the case, a half or more of the guided light component can be extracted as polarized light. The organic EL cell can be provided as a cell that exhibits high efficiency when the cell is applied to a polarizing-type planar light source used in a liquid crystal display device.

For this reason, in accordance with the invention, the life of the cell can be prolonged because electric power consumption can be reduced greatly to thereby reduce the current flowing in the cell. In addition, the light-extracting efficiency of the organic EL cell can be improved. Accordingly, if internal quantum efficiency of the organic EL cell is improved with the advance of improvement in organic EL material, electrode material, etc., light-emitting efficiency will be improved according to the synergy between the light-extracting efficiency and the internal quantum efficiency to thereby make the effect of the invention higher.

DETAILED DESCRIPTION OF THE PREFERRED EMBODIMENTS

Embodiments of the invention will be described below with reference to the drawings.

Figure 1:
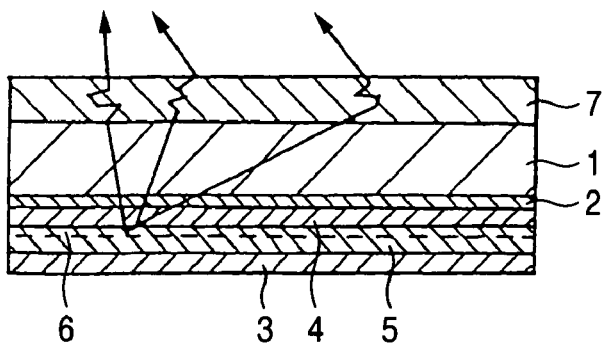
FIG. 1 is a sectional view showing a first embodiment of an organic electroluminescence cell according to the invention.

FIG. 1 shows an example of a two-layer type organic EL cell according to the invention. The cell is basically configured so that a transparent electrode 2, a hole transport layer 4, an electron transport light-emitting layer 5 and a reflective electrode 3 are laminated successively on a support substrate 1.

That is, the cell is configured so that an organic layer composed of a hole transport layer 4 and an electron transport light-emitting layer 5 as described above is sandwiched between a pair of electrodes constituted by a transparent electrode 2 and a reflective electrode 3. When the cell operates, hole-electron recombination occurs in a region on the electron transport light-emitting layer side about 10 nm distant from an interfacial layer between the hole transport layer 4 and the electrode transport light-emitting layer 5. As a result, luminescence is generated while concentrated in a light-emitting region 6 shown in FIG. 1.

Incidentally, another organic EL cell than the two-layer type organic EL cell, for example, a three-layer type organic EL cell having a hole transport layer, a light-emitting layer and an electron transport layer operates as follows. When a voltage is applied between electrodes (i.e., an anode and a cathode), holes injected from the anode and electrons injected from the cathode are moved in carrier transport layers respectively and recombined in the light-emitting layer to produce excitons. As a result, luminescence is generated in the same manner as in the two-layer type organic EL cell.

The invention is also basically configured so that light beams generated particularly in a frontal direction interfere with each other destructively but guided light beams confined in the inside of the cell interfere with each other constructively. This feature will be described with reference to FIG. 2.

Figure 2:
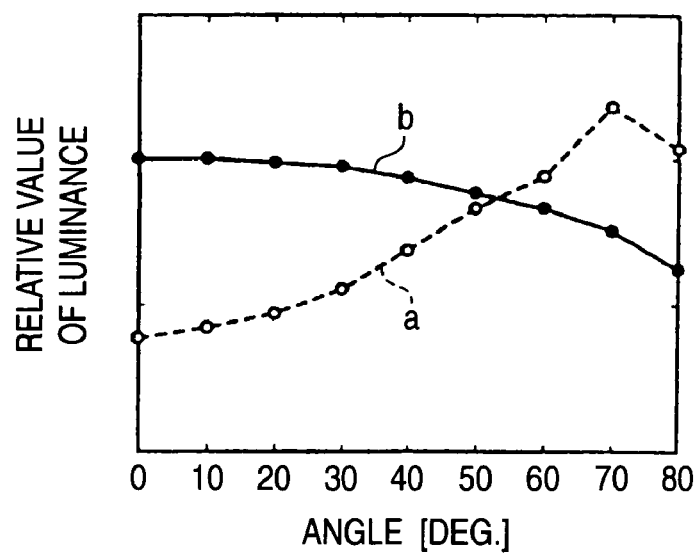
FIG. 2 is a characteristic graph showing basic configurations of organic electroluminescence cells according to the invention and the related art (before a region for disturbing the angle of reflection/refraction is formed on each basic configuration)

FIG. 2 is a characteristic graph in the case where the angular distribution of luminance of the organic EL cell having only the basic configuration (i.e., before provision of a reflection/refraction angle disturbance region which will be described later) is measured at intervals of 10 degrees in an angle range of from 0 degrees to 80 degrees viewed from the frontal direction. In FIG. 2, the curve a represents an organic EL cell according to the invention, and the curve b represents an organic EL cell according to the related art.

Incidentally, in the basic configuration, the transparent electrode 2 is 100 nm thick, the hole transport layer 4 is 50 nm thick, and the electron transport light-emitting layer 5 is 140 nm thick (according to the invention) or 60 nm thick (according to the related art). The measurement is made in the condition that a voltage is applied between the electrodes so that the same current flows in each of the cell according to the invention and the cell according to the related art.

As is obvious from FIG. 2, the cell according to the related art exhibits a preferred perfect diffuse type luminance distribution in which the frontal luminance value, that is, the luminance value in a direction of 0 degrees from the frontal direction is high and in which, moreover, the luminance value is kept approximately constant on a relatively wide angle range. On the contrary, the cell according to the invention exhibits characteristic in which the frontal luminance value is low and in which, moreover, luminance increases as the angle increases. That is, the cell according to the invention is configured so that dependence of the luminance on the angle satisfies the expression:

$$B_0 < B_\theta \tag{1}$$

in which $B_0$ is the frontal luminance value, and $B_\theta$ is the luminance value in an angle range of from 50° to 70°.

Although this example has been described on the case where the relation given by the expression (1) is achieved on the basis of variation in thickness of the electron transport light-emitting layer 5, the relation can be achieved optionally it the materials, thicknesses, etc. of the light-emitting layer 5—containing organic layer and the pair of electrodes are selected suitably.

In a more preferred embodiment of the invention, the cell may be configured to satisfy the expression:

$$(0.3/n)\lambda < d < (0.5/n)\lambda \tag{2}$$

in which d is the distance between an approximate center portion of the hole-electron recombination light-emitting region 6 and the reflective electrode 3, λ is the peak wavelength of a fluorescence spectrum of a material used in the light-emitting layer (i.e., the electron transport light-emitting layer 5 in this case) and n is the refractive index of the organic layer (i.e., the electron transport light-emitting layer 5 in this case) between the light-emitting layer and the reflective electrode 3.

When, for example, the electron transport light-emitting layer 5 in the aforementioned example generates green fluorescence with a peak wavelength of 540 nm and has a refractive index of 1.65, the distance d is preferably selected to be in a range of from 98.2 nm to 163.6 nm.

In addition to the basic configuration satisfying the expression (1) or preferably the expression (2), the invention is characterized in that a region 7 for disturbing the angle of reflection/refraction of light is further provided between the light-emitting layer and an output medium on the observer side.

That is, when light origin ally confined as guided light enters the region 7, the angle of transmission of the light is changed. Part of the light having the angle of transmission changed to a smaller angle than the angle of total reflection emerges from the cell. The other part of the light finally emerges from the cell while repeatedly reflected and scattered in the cell. As a result, an aimed high light-emitting efficiency can be achieved.

In order to satisfy the expression (1) or (2), it may be necessary to make the thickness of the organic layer somewhat larger than the thickness generally used in the organic layer. In this case, because the film thickness becomes larger, electrical short-circuiting caused by defects, fine bumps in the electrodes, etc. can be reduced to bring about an advantage of improvement in yield but the resistance of the cell increases in accordance with increase in film thickness to bring about a problem of increase in operating voltage. That is, though efficiency (cd/A) per unit current may be improved, there is the possibility that the amount (lm/W) of luminous flux per unit electric power will be equal to or lower than that in the related art according to circumstances.

For example, this problem can be avoided by a method disclosed in Unexamined Japanese Patent Publication No. 2000-182774 and references cited therein. That is, in the disclosed method, the electric resistance of the organic layer is reduced by means of mixing a metal organic complex compound containing alkali metal ions, alkali earth metal ions, rare earth metal ions or the like with an organic EL material so that the organic layer can. be thickened while increase in operating voltage is suppressed. There is no limit to a dopant material represented by a metal complex added to the mixture layer and to a mixing method used. Any suitable method can be used. Because the effect of the invention can be obtained by such a method without increase in operating voltage, power efficiency as well as current efficiency can be improved.

Although the expression (2) is applied to the case where luminescence generated in the organic EL cell is monochromatic light, the effect of the invention can be obtained sufficiently also in the case where the organic EL cell is a white cell using EL generated from a plurality of luminous materials such as red, green, blue, etc. It is a matter of course that luminous materials may be combined to generate light of white obtained by mixing blue and yellow, and that the invention can be used for generating light of any other color than white by color mixing. When, for example, three colors of red, green and blue are mixed, the expression (2) of the invention cannot be satisfied by all the colors. Therefore, when, for example, wavelength λ of a color exhibiting the lowest light-emitting efficiency in the three colors is used as the wavelength λ in the expression (2), total light-emitting efficiency can be improved. The organic EL cell can be produced to satisfy the expression (1) when an optimal configuration is selected suitably on the basis of respective emission spectra of the three colors. The white cell used can be configured in accordance with the related art, for example, of doping a host material of the light-emitting layer with red, green and blue pigments or separating the light-emitting layer into three layers, that is, red, green and blue layers. Incidentally, when the light-emitting layer is separated into three layers, the expression (2) of the invention can be satisfied by all the colors.

Further, it is significant to the invention that luminance values-measured externally before the formation of the reflection/refraction angle disturbance region have an angular distribution as represented by the expression (1). The angular distribution of luminance values after the formation of the reflection/refraction angle disturbance region is insignificant. When, for example, the cell is used for illuminating a wide range, it is preferable that the luminance values have a uniform angular distribution. When, for example, the cell is used as a backlight unit for a liquid crystal display device used in a cellular phone or a mobile apparatus, it is preferable that luminance at a wide angle is higher than frontal luminance. In this case, a prism sheet or the like may be preferably set.

Incidentally, when an-organic EL layer is formed on a substrate integrated with a diffusing layer in advance or on a substrate having diffusing characteristic in itself, the luminance distribution before the formation of the diffusing layer cannot be found. In this case, if the organic EL layer is formed on a general substrate having no diffusing characteristic in the same condition as described above, a judgment can be made easily as to whether the cell is adapted to the invention or not. If the laminated structure and the thicknesses of respective layers can be found from observation of a section of the cell with a transmission electron microscope, the angular distribution of luminance can be estimated to a certain degree.

In the invention, as the reflection/refraction angle disturbance region 7 is substantially provided so that the angle of transmission of light larger than the angle of total reflection can be efficiently disturbed into an angle of transmission not larger than the angle of total reflection. As the region 7 is formed so that larger part of guided light confined in the inside of the cell can be extracted from the cell, the aforementioned effect can be preferably obtained. Incidentally, the region 7 must be formed without interposition of any air layer between the region 7 and the light-emitting layer. This is because the effect of the invention cannot be obtained due to confinement of light which is caused by total reflection on the interface (air surface) before generated light enters the region 7 if there is air between the light-emitting layer and the region 7.

The method for forming the reflection/refraction angle disturbance region 7 is not particularly limited. For example, a method proposed in the related art can be used as it is.

For example, a light-diffusing site containing a transparent material, and a transparent or opaque material different in refractive index from the first-mentioned transparent material and dispersed/distributed into the first-mentioned transparent material may be formed. Specifically, when a glass or polymer material is used as the transparent material in the light-diffusing site, the transparent or opaque material dispersed/distributed into the glass or polymer material can be selected from silica particles, titania particles, zirconia particles, plastic particles, liquid crystal particles, air particles, etc. The refractive indices of the two materials, the refractive index difference between the two materials and the particle size of the particles are not particularly limited. It is preferable from the point of view of light scattering that the particle size is in a range of from 0.1 μm to 10 μm and the refractive index difference is not smaller than 0.05.

A lens structure can be also preferably used. The lens structure means a thin plate-like transparent substance which has a plurality of lenses, prisms or V-grooves arranged or formed into concentric circles, lines parallel to one another or grids and in which the direction of light advancing straight is changed by the plurality of lenses, prisms or V-grooves. Specifically, examples of the lens structure include a lenticular lens sheet, a Fresnel lens sheet, a cube corner lens sheet, a fly's eye lens sheet, a cat's eye lens-sheet, a double fly's eye lens sheet, a double lenticular lens sheet, a radial lenticular lens sheet, a prism lens film, a micro-prism lens film, a lens sheet obtained in such a manner that the convex surfaces of any one of the aforementioned lens sheets are converted into concave surface's, and a sheet of transparent or semitransparent spheres arranged in a plane. Alternatively, grooves such as V-grooves may be formed so that the direction of light can be changed. The material of each lens sheet may be glass or resin.

A surface of the support substrate or each interface may be formed as a physically bumpy surface. Any bumpy structure may be used for the bumpy surface. For example, all structures in a range of from a structure of the order of 1 mm to a structure of the order of 100 nm may be used. Specifically, a bumpy structure of the order of hundreds of nm, that is, a photonic crystal structure, formed by means of matting a surface of the support substrate, by means of thermally transferring a periodic bumpy structure onto a surface of the organic layer (polymer layer) or by a reactive ion etching method using a semiconductor production process may be also preferably used. The shape of the bumpy structure is optional. For example, the bumpy structure may be a periodic structure of regularly arranged bumps or a random structure. The pitch and aspect ratio of the bumpy structure are not particularly limited. Any structure can be suitably used if guided light confined in the inside of the cell can be extracted from the cell efficiently by the structure.

The position where the reflection/refraction angle disturbance region 7 is formed is not particularly limited. The region 7 can be formed in any position. For example, a diffusing film may be stuck onto a surface of the support substrate 1 through a tackiness agent or an adhesive agent to thereby form the region 7, or light-diffusing characteristic may be given to the support substrate 1 per se to thereby form the region 7, or the region 7 maybe formed between the transparent electrode 2 and the support substrate 1. When the cell is used for illumination requiring a relatively large emission area, the region 7 may be preferably formed on a surface of the substrate. When the cell is applied to a display device requiring a small emission area, the region 7 may be preferably formed in a position as near to the light-emitting layer as possible so that parallax caused by the transmission distance between the light-emitting layer and the reflection/refraction angle disturbance region can be reduced.

Figure 3:
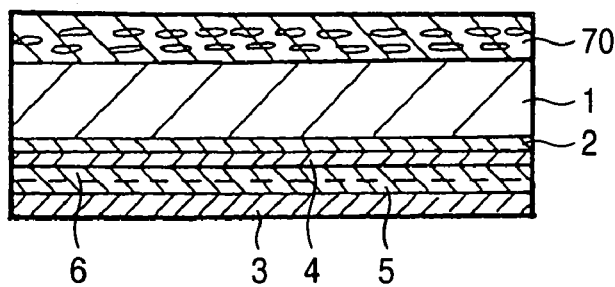
FIG. 3 is a sectional view showing a second embodiment of the organic electroluminescence cell according to the invention.

In the invention, a polarizing/scattering site 70 containing a light-transmissive resin, and micro domains different in birefringence characteristic from the light-transmissive resin and dispersed/distributed into the light-transmissive resin as shown in FIG. 3 may be formed as the reflection/refraction angle disturbance region. That is, in addition to the basic configuration satisfying the expression (1) and preferably the expression (2) like the organic EL cell shown in FIG. 1, the polarizing/scattering site 70 containing a light-transmissive resin, and micro domains different in birefringence characteristic from the light-transmissive resin and dispersed/distributed into the light-transmissive resin is formed substantially without interposition of any air layer so that the polarizing/scattering site 70 serves as a region which disturbs the angle of reflection/refraction of light while generated light is radiated from the electron transport light-emitting layer 5 toward the observer side through the transparent electrode 2. In this embodiment, the polarizing/scattering site 70 is formed on the light-extracting surface side of the support substrate 1.

According to this configuration, when light origin ally confined as guided light in the inside of the cell is made incident on the polarizing/scattering site 70, the angle of transmission of the light changes. Part of the light emerges from the cell because the angle of transmission of the light changes to a value smaller than the angle of total reflection. The other part of the light can emerge from the cell while it is repeatedly reflected and scattered in the inside of the cell. As a result, an aimed high light-emitting efficiency can be achieved. When the polarizing/scattering site 70 is used, generated light can be extracted as polarized light rich in its linearly polarized light component, and the direction of vibration of linearly polarized light can be changed optionally according to the installation angle of the polarizing/scattering site 70. Accordingly, when the cell is used as a backlight unit for a liquid crystal display device, the polarizing/scattering site 70 is excellently effective in reducing power consumption remarkably.

Although FIG. 3 shows the case where the polarizing/scattering,site 70 is formed directly on the'support substrate 1, the polarizing/scattering site 70 may be stuck to the support substrate 1 through a transparent tackiness or adhesive agent. In this case, the refractive index of the tackiness or adhesive agent may be preferably adjusted while the refractive indices of respective layers are taken into consideration so that light generated from the organic EL cell can be prevented to the utmost from being lost because of total reflection. For example, the refractive index of the tackiness agent is preferably selected to be higher than the refractive index of the support substrate 1 and lower than the refractive index of the light-transmissive resin of the polarizing/scattering site 70. According to this selection, total reflection can be avoided both in the interface between the support substrate and the tackiness agent and in the interface between the tackiness agent and the polarizing/scattering site, so that generated light can enter the polarizing/scattering site efficiently.

However, the refractive index of the tackiness or adhesive agent need not always satisfy the aforementioned relation. If the refractive index difference is not larger than about 0.1, there is no fear that the effect of the invention will be lowered remarkably.

The polarizing/scattering site 70 is not limited to the embodiment shown in FIG. 3. For example, the polarizing/scattering site 70 may be formed between the support substrate 1 and the transparent electrode 2. Even in the case where the support substrate 1 (glass substrate) is located on the polarizing/scattering site 70, the effect of the invention can be obtained.

The shape of the polarizing/scattering site 70 is not particularly limited if the polarizing/scattering site 70 has at least two flat surfaces opposite to each other. From the point of view of use as a polarizing-type planar light source and efficiency in total reflection, a film shape, a sheet shape or a plate shape can be preferably used. Especially, a film shape is preferred from the point of view of easiness of handling property. The thickness of the polarizing/scattering site 70 is selected to be preferably not larger than 10 mm, more preferably in a range of from 0.1 mm to 5 mm, most preferably in a range of from 0.4 mm to 2 mm.

The two surfaces opposite to each other maybe preferably selected to be smooth surfaces as close to mirror surfaces as possible from the point of view of efficiency in confinement of generated light due to total reflection. When the two opposite surfaces lack smoothness, the same effect can be still obtained if a separate light-transmissive film or sheet excellent in smoothness is stuck to the polarizing/scattering site 70 through a transparent adhesive or tackiness agent so that the interface of total reflection is provided as a smooth surface of the stuck light-transmissive film or sheet.

The polarizing/scattering site 70 can be formed by a suitable method such as a method of obtaining an oriented film by using one kind or two or more kinds of suitable materials such as polymers and liquid crystal materials excellent in transparency in combination so that regions different in birefringence characteristic are formed by a suitable orienting process such as a stretching process. Incidentally, examples of the combination include combination of a polymer and a liquid crystal material, combination of an isotropic polymer and an anisotropic polymer, and combination of anisotropic polymers. From the point of view of the dispersion/distribution of micro domains, a combination such as brings phase separation is preferred. The dispersion/distribution can be controlled on the basis of mutual solubility of materials combined. The phase separation can be performed by a suitable method such as a method of dissolving mutually insoluble materials in a solvent or a method of mixing mutually insoluble materials while thermally melting the mutually insoluble materials.

The combined materials can be oriented by a stretching process as follows. In the combination of a polymer and a liquid crystal material or in the combination of an isotropic polymer and an anisotropic polymer, when any stretching temperature and any magnification of stretching are selected, the aimed polarizing/scattering site can be formed. In the combination of anisotropic polymers, when the stretching condition is controlled, the aimed polarizing/scattering site can be formed.

Incidentally, anisotropic polymers are classified into positive and negative groups by characteristic of change in refractive index in the stretching direction. In the invention, either of positive and negative anisotropic polymers can be used. Positive anisotropic polymers or negative anisotropic polymers may be combined. Or a positive anisotropic polymer and a negative anisotropic polymer may be combined.

Examples of the polymer include: ester polymer such as polyethylene terephthalate, and polyethylene naphthalate; styrene polymer such as polystyrene, and acrylonitrile-styrene copolymer; olefin polymer such as polyethylene, polypropylene, cyclo or norbornene structure-containing polyolefin, and ethylene-propylene copolymer; acrylic polymer such as polymethyl methacrylate; cellulose polymer such as cellulose diacetate, and cellulose triacetate; and amide polymer such as Nylon, and aromatic polyamide.

Examples of the polymer further include: carbonate polymer; vinyl chloride polymer; imide polymer; sulfone polymer; polyether-sulfone; polyether-ether-ketone; polyphenylene sulfide; vinyl alcohol polymer; vinylidene chloride polymer; vinyl butyral polymer; arylate polymer; polyoxymethylene; silicone polymer; urethane polymer; ether polymer; vinyl acetate polymer; blends of these polymers; and heat-curable or ultraviolet-curable polymer such as phenol polymer, melamine polymer, acrylic polymer, urethane polymer, urethane acrylic polymer, epoxy polymer or silicone polymer.

Examples of the liquid crystal material include: low-molecular liquid crystal or crosslinkable liquid crystal monomers exhibiting a nematic or smectic phase at room temperature or at a high temperature; and liquid crystal polymers exhibiting a nematic or smectic phase at room temperature or at a high temperature. Specific examples of the liquid crystal material include a cyanobiphenyl compound, a cyanophenylcyclohexane compound, a cyanophenyl ester compound, a phenyl benzoate ester compound, a phenylpyrimidine compound, and mixtures of these compounds.

The crosslinkable liquid crystal monomer is generally crosslinked into a polymer by a suitable method using heat, light or the like after the orienting process.

To obtain the polarizing/scattering site 70 excellent in heat resistance, durability, etc., the crosslinkable liquid crystal monomer or liquid crystal polymer may be preferably combined with a polymer having a glass transition temperature of not lower than 50° C., especially not lower than 80° C., further especially not lower than 120° C.

The kind of the liquid crystal polymer is not limited. Any suitable polymer such as a main-chain polymer or a side-chain polymer may be used as the liquid crystal polymer. From the point of view of the formability and thermal stability of micro domains excellent in uniformity in particle size distribution, the moldability into a film, the facilitation of the orienting process, and so on, the degree of polymerization of the liquid crystal polymer which can be used preferably is not lower than 8, especially not lower than 10, further especially in a range of from 15 to 5000.

For example, the polarizing/scattering site is formed from the liquid crystal polymer by the following method. That is, at least one kind of polymer is mixed with at least one kind of liquid crystal polymer for forming micro domains to thereby form a polymer film containing the liquid crystal polymer dispersed in the form of micro domains. The polymer film is oriented by a suitable method to thereby form regions different in birefringence characteristic.

From the point of view of controllability of the refractive index differences $\Delta n_1$ and $\Delta n_2$ in the orienting process, a liquid crystal polymer having a glass transition temperature of not lower than 50° C. and exhibiting a nematic liquid crystal phase in a temperature range lower than the glass transition temperature of a polymer combined with the liquid crystal polymer is used preferably.

Specifically, a side-chain liquid crystal polymer having a monomer unit represented by the following general formula (A) is used.

(A)

A suitable heat-curable polymer such as a homopolymer or a copolymer having a monomer unit represented by the general formula (A) may be used as the side-chain liquid crystal polymer. A polymer excellent in monodomain orienting characteristic is preferred.

In the general formula (A), X is a skeleton group which forms a main chain of the liquid crystal polymer and which may be constituted by a suitable linkage chain such as a linear chain, a branched chain or a cyclic chain. Specific examples of X include polyacrylate, polymethacrylate, poly-α-haloacrylate, poly-α-cyanoacrylate, polyacrylamide, polyacrylonitrile, polymethacrylonitrile, polyamide, polyester, polyurethane, polyether, polyimide, and polysiloxane.

In the general formula (A), Y is a spacer group branched from the main chain. Examples of Y preferred from the point of view of the formability of the polarizing/scattering site such as refractive index controllability include ethylene, propylene, butylene, pentylene, hexylene, octylene, decylene, undecylene, dodecylene, octadecylene, ethoxyethylene, and methoxybutylene.

In the general formula (A), Z is a mesogen group which gives liquid crystal orienting characteristic.

For example, the polarizing/scattering site is formed from a nematic liquid crystal polymer by the following method. That is, a polymer for forming a polymer film is mixed with a liquid crystal polymer which exhibits a nematic liquid crystal phase in a temperature range lower than the glass transition temperature of the polymer and which has a glass transition temperature of not lower than 50° C., especially not lower than 60° C., further especially not lower than 70° C. Thus, a polymer film containing the liquid crystal polymer dispersed in the form of micro domains is formed. The liquid crystal polymer which forms the micro domains is heated so as to be oriented in the form of a nematic liquid crystal phase. Then, the liquid crystal polymer is cooled to fix the oriented state of the liquid crystal polymer.

The polymer film containing the micro domains dispersed, that is, the film to be oriented, can be produced by a suitable method such as a casting method, an extrusion molding method, an injection molding method, a roll molding method or a flow-out molding method. Alternatively, the film can be also produced by a method in which a monomer-state material is expanded and polymerized by a heating process or by a process of radiation such as ultraviolet rays to thereby form a film.

From the point of view of obtaining the polarizing/scattering site 70 excellent in uniform distribution of the micro domains, there maybe preferably used a method in which a mixture solution containing forming materials dissolved in a solvent is used for forming a film by a casting method, a flow-out molding method or the like. In this case, the size of each micro domain and the distribution of the micro domains can be controlled suitably on the basis of the kind of the solvent, the viscosity of the mixture solution, the drying speed of the expended layer of the mixture solution, and so on. Incidentally, reduction in viscosity of the mixture solution and increase in drying speed of the expended layer of the mixture solution are effective in reducing the area of each micro domain.

The thickness of the film to be oriented can be decided suitably. From the point of view of the facilitation of the orienting process, the thickness is generally selected to be in a range of from 1 µm to 3 mm, especially in a range of 5 µm to 1 mm, further especially in a range of from 10 µm to 500 µm. At the time of formation of the film, suitable additives such as a dispersing agent, a surface active agent, a color adjusting agent, a flame retarding agent, a releasing agent and an anti-oxidizing agent may be mixed.

The orienting process can be carried out by use of at least one method selected from various methods in which the refractive index can be controlled on the basis of orientation. Examples of the various methods include: a stretching or calendering method using uniaxial or biaxial treatment, sequential biaxial treatment or Z axial treatment; a method of fixing orientation by rapidly cooling the film after applying an electric or magnetic field to the film at a temperature of not lower than the glass or liquid crystal transition temperature; a method of fluid-orienting liquid crystal at the time of formation of the film; and a method of self-orienting liquid crystal on the basis of slight orientation of an isotropic polymer. Therefore, the polarizing/scattering site 70 obtained may be a stretched film or may be a non-stretched film.

Incidentally, when the polarizing/scattering site 70 is a stretched film, a brittle polymer can be used but a polymer excellent in stretchability may be used preferably.

When the micro domains are made of a liquid crystal polymer, the orienting process can be carried out, for example, by a method in which: a polymer film is heated and melted at a temperature at which a liquid crystal polymer dispersed/distributed as micro domains in the polymer film exhibits an aimed liquid crystal phase such as a nematic phase; the liquid crystal polymer is oriented under the action of orientation limiting force; and the polymer film is cooled rapidly to fix the oriented state. It is preferable from the point of view of preventing variation in optical characteristic that the oriented state of the micro domains satisfies a monodomain state as sufficiently as possible.

Incidentally, as the orientation limiting force, there can be used a suitable limiting force by which the liquid crystal polymer can be oriented, such as stretching force due to a method of stretching the polymer film at a suitable magnification or shearing force or electric or magnetic field at the time of formation of the film. The liquid crystal polymer can be oriented by the action of at least one kind of limiting force selected from these kinds of limiting force.

Therefore, the other portions than the micro domains in the polarizing/scattering site may exhibit birefringence or may be isotropic.

A polarizing/scattering site exhibiting birefringence as a whole can be obtained by molecular alignment or the like in the film-forming process using an oriented birefringent polymer as the polymer for forming a film: If necessary, known orienting means such as a stretching process can be used for giving or controlling birefringence.

A polarizing/scattering site in which the other portions than the micro domains are isotropic can be obtained, for example, by a method in which: anisotropic polymer is used as the polymer for forming a film; and the film is stretched in a temperature range not higher than the glass transition temperature of the polymer.

Preferably, in the invention, refractive index differences $\Delta n_1$, $\Delta n_2$ and $\Delta n_3$ between the macro domains and the other portions, that is, between the micro domains and the portions made of the light-transmissive resin in respective optically axial directions of the micro domains are controlled so that $\Delta n_1$ in an axial direction ($\Delta n_1$ direction) where the refractive index differences are maximized is in a range of from 0.03 to 0.5, and that each of $\Delta n_2$ and $\Delta n_3$ in two axial directions ($\Delta n_2$ direction and $\Delta n_3$ direction) perpendicular to the $\Delta n_1$ direction is not smaller than 0.03. More preferably, controlling is performed so that $\Delta n_2$ and $\Delta n_3$ are equal to each other. When the refractive index differences are controlled in this manner, linearly polarized light in the $\Delta n_1$ direction is scattered intensely so that the amount of light scattered at an angle smaller than the critical angle and emerging from the polarizing/scattering site can be increased, but linearly polarized light in the other directions is hardly scattered so that the light can be confined in the inside of the polarizing/scattering site while total reflection is repeated.

Incidentally, when the light-transmissive resin is optically isotropic, the refractive index difference between the micro domains and the other portions in each optically axial direction of the micro domains means the difference between the refractive index of the micro domains in each optically axial direction and the average refractive index of the light-transmissive resin. When the light-transmissive resin is optically anisotropic, the refractive index difference means the difference between the refractive index of the micro domains and the refractive index of the light-transmissive resin in each axial direction because the main optically axial direction of the light-transmissive resin generally coincides with the main optically axial direction of the micro domains.

In the invention, it is preferable from the point of view of the total reflection that the refractive index difference $\Delta n_1$ in the $\Delta n_1$ direction is moderately large. The refractive index difference $\Delta n_1$ is selected to be especially in a range of from 0.035 to 0.5, further especially in a range of from 0.040 to 0.45. On the other hand, it is preferable that the refractive index differences $\Delta n_2$ and $\Delta n_3$ in the $\Delta n_2$ and $\Delta n_3$ directions are as small as possible. That is, it is preferable that the refractive index differences $\Delta n_2$ and $\Delta n_3$ are as zero as possible. These refractive index differences can be controlled on the basis of the refractive indices of the materials used, the aforementioned orienting operation, and so on.

Preferably, the $\Delta n_1$ direction is parallel to two opposite surfaces of the polarizing/scattering site because the $\Delta n_1$ direction forms a plane of vibration of linearly polarized light output from the polarizing/scattering site. Incidentally, the $\Delta n_1$ direction in a plane can be selected as a suitable direction according to an aimed liquid crystal cell or the like.

It is preferable from the point of view of uniformity of the scattering effect that the micro domains in the polarizing/scattering site are dispersed/distributed as evenly as possible. The size of each micro domain, especially the length in the $\Delta n_1$ direction as a scattering direction, has relation with backward scattering (reflection) and wavelength dependency. From the point of view of improvement in light utilization efficiency, prevention of coloring due to wavelength dependency, prevention of visibility inhibition or sharp display inhibition due to the sight of the micro domains, film formability, film strength, etc., the preferred size of each micro domain, especially the preferred length in the $\Delta n_1$ direction, is in a range of from 0.05 μm to 500 μm, especially in a range of from 0.1 μm to 250 μm, further especially in a range of from 1 μm to 100 μm. Incidentally, each micro domain generally exists in a domain state in the polarizing/scattering site. The length of each micro domain in the $\Delta n_2$ direction or the like is not particularly limited.

The percentage of the micro domains in the polarizing/scattering site 70 can be decided suitably according to the scattering characteristic in the $\Delta n_1$ direction. Generally, from the point of view of film strength, the percentage of the micro domains is preferably selected to be in a range of from 0.1% by weight to 70% by weight, especially in a range of from 0.5% by weight to 50% by weight, further especially in a range of from 1% by weight to 30% by weight.

In the invention, the polarizing/scattering site 70 may be formed as a single layer or may be formed as a laminate of two or more layers. When the polarizing/scattering site 70 is formed as a laminate, a synergistic scattering effect higher than that proportional to increase in thickness can be obtained. It is preferable from the point of view of increase in scattering effect that the laminate is formed so that $\Delta n_1$ directions in upper and lower layers are parallel to each other. The number of layers to be laminated can be set at a suitable value of 2 or greater. In the polarizing/scattering site 70, the layers to be laminated may be equalized in $\Delta n_1$, $\Delta n_2$, etc. or may be differentiated in $\Delta n_1$, $\Delta n_2$, etc.

Although it is preferable that $\Delta n_1$ directions or the like in upper and lower layers are as parallel to each other as possible, variation caused by work error may be permitted. When the $\Delta n_1$ direction varies, the average direction is regarded as the $\Delta n_1$ direction.

Because the polarized state of light needs to be eliminated suitably in the process in which the light is propagated through the polarizing/scattering site 70, it is preferable that the polarizing/scattering site 70 has a retardation on the whole or part of the planar light source. Fundamentally, because the slow axis of the polarizing/scattering site and the axis of polarization (plane of vibration) of linearly polarized light hardly scattered are perpendicular to each other, conversion of polarized light caused by the retardation hardly occurs. It is however conceived that conversion of polarized light occurs because the apparent angle is changed by slight scattering.

Although the in-plane retardation varies according to the thickness of the polarizing/scattering site, it is generally preferable from the point of view of conversion of polarized light that the in-plane retardation is not smaller than 5 nm. The retardation can be given by a suitable method such as a method using birefringent fine particles to be contained in the site, a method using birefringent fine particles to be deposited on a surface of the site, a method using a light-transmissive resin having birefringence, a method using these methods in combination, and a method of integrally laminating birefringent films.

In the invention, a light-diffusing layer or a lens structure which is the same as in the organic EL cell shown in FIG. 1 may be formed as a reflection/refraction angle disturbance region substituted for the polarizing/scattering site 70. A reflection type polarizing element may be further set on the observer side of this region. In this case, output light can be extracted as polarized light efficiently. Accordingly, an organic EL cell in which absorption of light to the polarizer is minimized can be produced.

Figure 4:
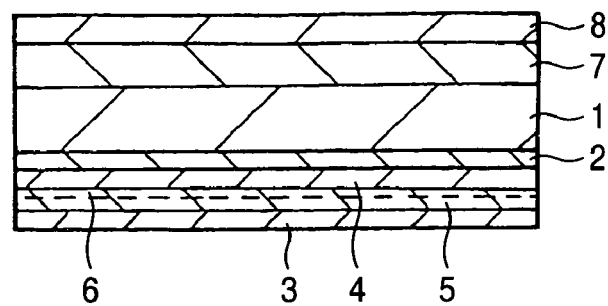
FIG. 4 is a sectional view showing a third embodiment of the organic electroluminescence cell according to the invention.

FIG. 4 shows an example of the organic EL cell. A basic configuration of the organic EL cell is formed in the same manner as the organic EL cell shown in FIG. 1. That is, the basic configuration of the organic EL cell has a structure in which a transparent electrode 2, a hole transport layer 4, an electron transport light-emitting layer 5 containing a light-emitting region 6 and a reflective electrode 3 are laminated successively on a support substrate 1. The basic configuration of the organic EL cell is formed to satisfy the expression (1) and preferably satisfy the expression (2). Moreover, a light-diffusing layer or a lens structure is formed as a reflection/refraction angle disturbance region 7. A reflection type polarizing element 8 is further provided on the observer side of the region 7.

The reflection type polarizing element 8 operates as follows. Light transmitted through the reflection type polarizing element 8 as polarized light obtained from generated light guided to the reflection type polarizing element 8 through the region 7 is supplied to a polarizer to reduce absorption loss. On the other hand, light reflected by the reflection type polarizing element 8 is returned to the reflection type polarizing element 8 through a reflecting layer in a planar light source. Part or the whole of the light is transmitted as predetermined polarized light through an absorption type polarizer to increase the intensity of light allowed to be utilized by a liquid crystal display device to thereby improve luminance. A reflection type polarizing element capable of reflecting 40% or greater of polarized light is preferred from the point of view of improvement in luminance.

A suitable polarizing element that can obtain both reflected light and transmitted light at the time of incidence of natural light is used as the reflection type polarizing element 8. Specific examples of the reflection type polarizing element 8 include: a reflection type circular polarizing element (circularly polarized light separating sheet) made of a cholesteric liquid crystal layer; and a reflection type linear polarizing element (linearly polarized light separating sheet)

made of a multilayer laminate of at least two kinds of materials different in refractive index (Unexamined Examined Japanese Patent Publications (Kohyo) Nos. Hei. 9-506984 and 9-507308).

The reflection type circular polarizing element is made of a cholesteric liquid crystal layer oriented in Grandjean texture. The reflection type circular polarizing element separates incident light into reflected light and transmitted light each constituted by either left-handed circularly polarized light or right-handed circularly polarized light. The reflection type linear polarizing element separates incident light into reflected light and transmitted light constituted by linearly polarized light having planes of vibration perpendicular to each other. For example, a reflection type linear polarizing element "DBEF" made by 3M Company is available on the market.

As the cholesteric liquid crystal layer in the reflection type circular polarizing element, there can be used a suitable polarizing element exhibiting characteristic of reflecting part of incident light as either left-handed circularly polarized light or right-handed circularly polarized light and transmitting the other part of the incident light. The kind of the cholesteric liquid crystal layer is not particularly limited.

Generally, the reflection type circular polarizing element is provided as a structure in which a film of a cholesteric liquid crystal polymer or a cholesteric liquid crystal layer adheres closely onto a transparent substrate so as to be supported by the transparent substrate. To obtain circularly polarized light transmitted in a wide wavelength range, the reflection type circular polarizing element may have a structure in which at least two cholesteric liquid crystal layers having different reflection wavelength ranges are laminated.

Incidentally, when the organic EL cell according to the invention is used as a backlight unit for a liquid crystal display device, light emerging from the reflection type circular polarizing element is circularly polarized light. The circularly polarized light can be however changed to linearly polarized light easily, for example, by use of a quarter-wave plate.

Figure 5:
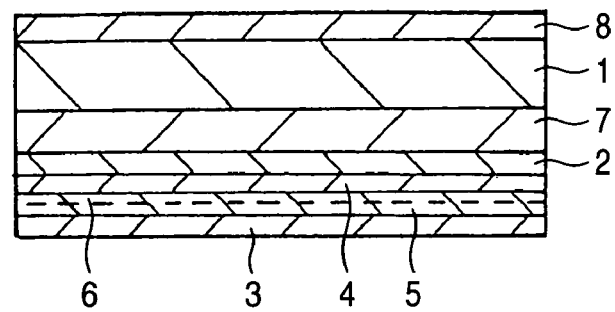
FIG. 5 is a sectional view showing a fourth embodiment of the organic electroluminescence cell according to the invention.
Figure 6:
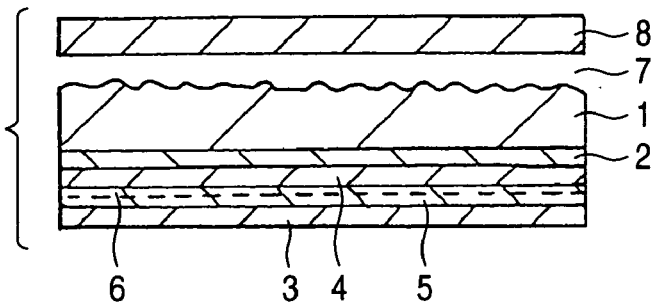
FIG. 6 is a sectional view showing a fifth embodiment of the organic electroluminescence cell according to the invention.
Figure 7:
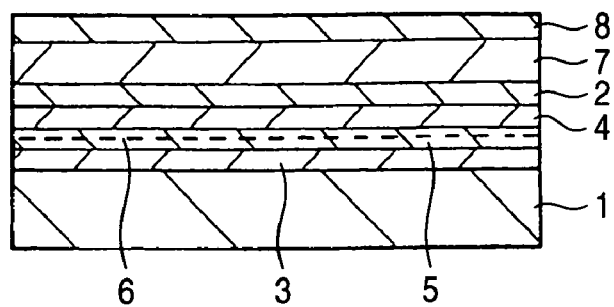
FIG. 7 is a sectional view showing a sixth embodiment of the organic electroluminescence cell according to the invention.

In the invention, the reflection type polarizing element 8 can operate if it is formed on the observer side, that is, on the outside of the reflection/refraction angle disturbance region 7. On this occasion, the position of the reflection type polarizing element 8 is not particularly limited. For example, the reflection type polarizing element 8 may be disposed through an air layer, or the reflection type polarizing element 8 may be stuck onto the region 7 directly or through an adhesive or tackiness agent. A layer having another function, such as a moistureproof layer, may be additionally provided between the region 7 and the reflection type polarizing element B. FIGS. 5 to 7 show other examples than FIG. 4.

FIG. 5 shows an example in which: the reflection/refraction angle disturbance region 7 is provided so as to be adjacent to the transparent electrode 2; and the reflection type polarizing element 8 is provided thereon through the support substrate 1. FIG. 6 shows an example in which: a microlens structure formed in a surface of the support substrate 1 is used as the reflection/refraction angle disturbance region 7; and the reflection type polarizing element 8 is provided on the microlens structure through an air layer. Other constituent parts in each of; FIGS. 5 and 6 as those in FIG. 4 and are denoted by the same reference numerals, so that the description of the parts will be omitted.

FIG. 7 shows an example of a so-called top extraction system in which a reflective electrode 3, an electron transport light-emitting layer 5, a hole transport layer 4, a transparent electrode 2, a reflection/refraction angle disturbance region 7 and a reflection type polarizing element 8 are provided successively on a support substrate 1 so that generated light is extracted from a surface side opposite to the support substrate 1. In this case, the support substrate 1 need not be transparent.

The organic EL cell having this configuration is best adapted to a backlight unit for a liquid crystal display device because output light can be extracted as polarized light. The organic EL cell is optimal for the field requiring power saving because of reduction in weight, thickness and size and battery capacity as in a cellular phone or a mobile apparatus.

Figure 8:
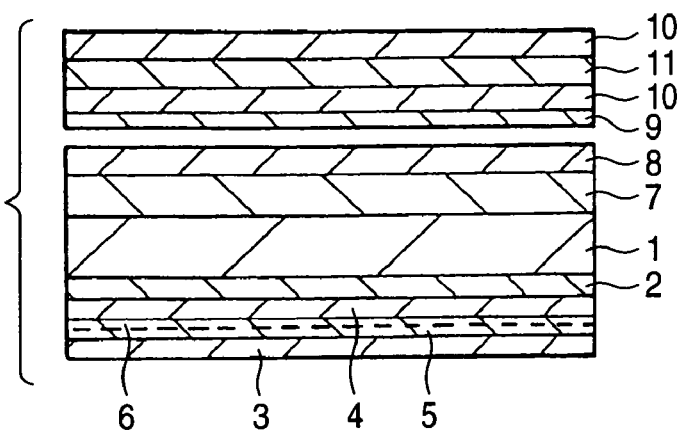
FIG. 8 is a sectional view showing an example of a liquid crystal display device using the organic electroluminescence dell according to the invention.
Figure 9:
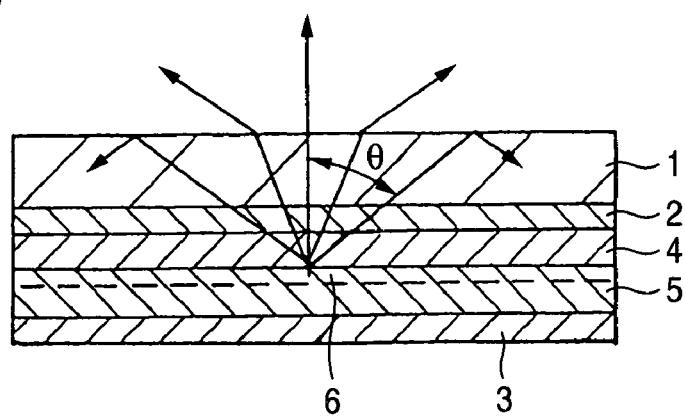
FIG. 9 is a view for explaining the principle of the organic electroluminescence cell according to the invention.

FIG. 8 shows an applied example in the case where a reflection type circular polarizing element made of a cholesteric liquid crystal layer is used as the reflection type polarizing element 8 in the organic EL cell shown in FIG. 4. In this case, because the organic layer in the organic EL cell is a-thin layer with a thickness of 500 nm at the most, the reflection/refraction angle disturbance region 7 can be formed to have a thickness of 200 μm or smaller (to about 50 μm). Accordingly, when a glass plate used as the support substrate 1 is made thin or when a resin film is used as the support substrate 1, reduction in thickness, size and weight can be achieved compared with a related-art backlight unit using a light pipe.

In FIG. 8, the guided light component is intensified by the organic EL cell having the aforementioned configuration, so that the total amount of light is substantially amplified. The light is extracted by the reflection/refraction angle disturbance region 7 efficiently. A half of light incident on the reflection type polarizing element 8 is transmitted as circularly polarized light. The other half of the light is reflected as reversed circularly polarized light. The circularly polarized light enters the region 7 again. In the region 7, the light is scattered, so that the polarized state is eliminated. As a result, the light is changed to natural light. The natural light is scattered backward by the region 7 or reflected by the reflective electrode 3 so as to be made incident on the reflection type polarizing element 8 again. A half of the incident light is transmitted as circularly polarized light through the reflection type polarizing element 8.

While this process is repeated, 50% or more of generated light is led to the outside. Circularly polarized light passed through the reflection type polarizing element 8 is converted into linearly polarized light by the quarter-waveplate 9. When the direction of vibration of the linearly polarized light is made coincident with the transmission axis of the lower polarizer 10 of the liquid crystal display cell, the linearly polarized light can enter the liquid crystal cell 11 as it is without influence of absorption loss due to the lower polarizer 10.

Although the quarter-wave plate for converting circularly polarized light into linearly polarized light serves as a phase retarder film having an in-plane retardation of ¼, the function of the quarter-wave plate cannot operate accurately for oblique light because of change in optical path length. For this reason, circularly polarized light obliquely incident on the quarter-wave plate cannot be perfectly converted into linearly polarized light, so that part of light output from the quarter-wave plate is absorbed to the lower polarizer.

This problem can be solved when an optically compensating layer (plate) is inserted as a layer which is not anisotropic in an in-plane direction and in which a refractive index in a direction of thickness is higher than a refractive index in the in-plane direction. Alternatively, the quarter-wave plate per se to be used may-be formed so as to exhibit change in refractive index in the direction of thickness so that an optically compensating function can be added to the quarter-wave plate.

These optically compensating methods have been disclosed, for example, in Unexamined Japanese Patent Publication No. Hei. 11-231132. In the invention, there is no limit to these optically compensating methods, and there is no limit to materials used for these optically compensating methods.

Strictly speaking, the polarized state or polarizing element meant in the invention is not in a perfectly linearly or circularly polarized state. The polarized state or polarizing element is actually in an elliptically polarized state slightly different from the perfectly linearly or circularly polarized state. That is, the concept "linearly polarized light" or "circularly polarized light" used in the invention includes elliptically polarized light slightly different from perfectly linearly or circularly polarized light. Even in the case where the polarized state is not perfect, the effect of the invention can be obtained sufficiently.

The basic configuration of the organic EL cell according to the invention, that is, the organic material, the electrode material, the layer configuration, the thickness of each layer and so on are not limited. For example, the related art can be applied to the basic configuration as it is.

Besides the two-layer type organic EL cell having an anode, a hole transport layer, an electron transport light-emitting layer and a cathode, a three-layer type organic EL cell having an anode, a hole transport layer, a light-emitting layer, an electron transport layer and a cathode or any other type cell than these laminated cells, such as a cell having an anode, a light-emitting layer and a cathode, can be selected as a specific configuration without any particular limitation.

A hole injection layer may be provided on an anode interface or an electron injection layer may be provided on a cathode interface. An electron block layer or a hole block layer may be inserted in order to improve recombination efficiency. Fundamentally, when the configuration, the materials and the forming method are selected so that light-emitting efficiency can be improved, intensive EL emission can be obtained in spite of low power consumption so that the effect of the invention can be enhanced more greatly.

The organic EL cell according to the invention is preferably configured so that one of the anode and the cathode is provided as a transparent electrode and the other as a reflective electrode as high in reflectance as possible. Although this configuration is preferable because the effect of interference appears more remarkably, the other electrode need not be provided as a reflective electrode.

The two electrodes may be provided as transparent electrodes. The reflective electrode may be an electrode which is semitransparent and relatively low in reflectance. Conversely, the reflective electrode may be an electrode which is made of a dielectric mirror or the like and which is very high in reflectance. In short, it is important that the expression (1) is satisfied.

Optimal materials can be selected suitably as the electrode materials. In the general organic EL cell, a transparent electrically conductive film represented by a material such as indium tin oxide (ITO), tin oxide or zinc oxide doped with an appropriate dopant is used as the anode whereas an electrode obtained by co-deposition of Mg and Ag vapors at an atomic ratio of about 10:1, an electrode of Ca, an electrode of Al doped with a small amount of Li, or the like, is applied to the cathode from the point of view of improvement in electron injection efficiency due to reduction in work function of the cathode. There is however no particular limit to the electrode materials.

Besides the provision of the anode as a transparent electrode of ITO or the like, a metal electrode is formed as a cathode having a thickness of from the order of m to the order of tens of nm from the organic layer surface to retain light transmissibility before ITO or the like is formed on the metal electrode to provide the cathode as a transparent electrode. The electrodes may be also formed as a so-called double-side extraction structure in which both the anode and the cathode are provided as transparent electrodes in the same manner as described above so that generated light can be extracted from both the anode and the cathode. A reflection/refraction angle disturbance region may be formed on one or each of the electrodes.

Although it is most preferable that the emission distributions both on the cathode side and on the anode side satisfy the expression (1), the effect of the invention can be obtained if either of the emission distributions satisfies the expression (1). A reflection/refraction angle disturbance region may be formed on one or each of the two electrode sides. Reflection/refraction angle disturbance regions different in characteristic may be stuck onto the two electrode sides respectively. The position of the reflection/refraction angle disturbance region can be selected optionally according to the purpose of use because the effect of the invention is not spoiled even in the case where the region is formed on a surface not satisfying the expression (1).

Examples of the method for forming the double-side extraction structure include: a method of mixing a low work function metal represented by alkali metal with the organic layer to thereby make it possible to inject electrons from an ITO electrode (Matsumoto, "OPTRONICS", No. 2, p. 136, 2003); and a method of inserting a metal complex material such as copper phthalocyanine in between an electron transport layer and ITO (Asuka et al., Appl. Phy. Lett., Vol. 78, p. 3343, 2001).

In the invention, the material of the organic layer (organic EL material) is not limited. Either low-molecular material or high-molecular material can be used preferably. That is, a low-molecular material may be formed by a vapor deposition method or a high-molecular material may be formed by a coating method or the like. There is no particular limit to the material.

Even a high-molecular organic EL cell can be produced to satisfy the expression (1) if the degree of electron mobility and hole mobility and the configuration of the cell are selected appropriately. When the cell is formed as a molecular structure in which a site trapping either carrier is introduced in the cell, the recombination light-emitting region can be limited to a specific site so that the expression (2) is satisfied.

For example, in a single-layer type cell having a transparent electrode (anode), a light-emitting layer and a reflective electrode (cathode), when the light-emitting layer is formed so that its electron transportability is higher than its hole transportability, electrons and holes can be recombined mainly on the anode side far from the reflective electrode. Accordingly, when the thickness of the light-emitting layer is adjusted suitably, the expression (2) as well as the expression (1) can be satisfied. Examples of the carrier trapping material include copolymers of polyphenylene vinylene derivatives as reported by Matsmurua et al. (M. Matsumura et al., Appl. Phy. Lett., Vol. 79, p. 4491, 2001).

As the support substrate in the organic EL cell according to the invention, a general substrate can be used regardless of transparency. A glass substrate may be used so that generated light can be extracted on the glass substrate side through the transparent electrode. Alternatively, an opaque metal plate may be used as the support substrate so that light can be extracted on a side opposite to the support substrate. A flexible material such as a high-molecular film may be used as the material of the support substrate or a reflection/refraction angle disturbance region may be formed in the support substrate per se. A reflection/refraction angle disturbance region may be formed between the support substrate and the transparent electrode. In the invention, even in the case where the support substrate is disposed on the reflection/refraction angle disturbance region, the effect of the invention can be also obtained.

Specific examples of the material of a high-molecular film used as the support substrate include polyethylene terephthalate, triacetyl cellulose, polyethylene naphthalate, polyether-sulfone, polycarbonate, polyacrylate, polyether-ether-ketone, and norbornene resin.

When the support substrate is located on the light-outputting surface side viewed from the polarizing/scattering site which is a reflection/refraction angle disturbance region, a material having no optical anisotropy, that is, exhibiting no birefringence needs to be selected as the material of the support substrate in order to retain linearly polarized light generated by the polarizing/scattering site.

If the support substrate exhibits birefringence, linearly polarized light output from the polarizing/scattering site is converted into elliptically polarized light in accordance with the relation of the optical axis and retardation with the linearly polarized light. As a result, when the organic EL cell is applied to a liquid crystal display device or the like, there is the possibility that the amount of a light component absorbed to a polarizer in the liquid crystal display device may increase. It is therefore necessary that a glass substrate, an epoxy resin substrate, a triacetyl cellulose film, a norbornene resin film, or any other available substrate having no optical anisotropy, is used as the support substrate in this case.

In the organic EL cell according to the invention, when a polarizing/scattering site is formed as the reflection/refraction angle disturbance region, a lens sheet or light-diffusing plate having polarization retaining characteristic, a wavelength cut filter, a phase retarder film, etc. can be used suitably as the light-extracting surface.

The lens sheet controls the optical path of output light (linearly polarized light) while keeping the degree of polarization of the light as constant as possible to improve frontal directivity advantageous to visibility to thereby direct the peak of intensity of scattered output light to the frontal direction.

The wavelength cut filter is used for the purpose of preventing light directly generated by an excitation light source from advancing straight, for example, to a liquid crystal display device. Particularly when excitation light is ultraviolet rays, it is necessary to prevent the liquid crystal and polarizer from being deteriorated by the ultraviolet rays. The wavelength cut filter may be also used for the purpose of removing visible light rays with unnecessary wavelengths. In the invention, if occasion demands, for example, an ultraviolet-absorbing agent or the like may be mixed with the polarizing/scattering site or other constituent members without provision of the wavelength cut filter so that a wavelength cut function can be given to the polarizing/scattering site or other constituent members.

When the organic EL cell according to the invention has at unique configuration as described above, there can be provided a planar light source of high light-emitting efficiency having the organic EL cell as a light-emitting device and a display device having the planar light source. Particularly when the organic EL cell has a polarizing/scattering site formed as a reflection/refraction angle disturbance region or when the organic EL cell has a light-diffusing layer or a lens structure formed as a reflection/refraction angle disturbance region, and a reflection type polarizing element further provided, there can be provided a polarizing-type planar light source of high light-emitting efficiency having the organic EL cell as a light-emitting device and,a display device such as a liquid crystal display device having the polarizing-type planar light source.

EXAMPLE 1

The invention will be described specifically in the following Examples 1-1 to 1-6 and Comparative Examples 1-1 to 1-6 in which a light-diffusing layer (light-diffusing tackiness agent) or a lens structure is provided as the reflection/refraction angle disturbance region in the organic EL cell according to the invention.

EXAMPLE 1-1

<Production of Basic Structure of organic EL Cell>

A 100 nm-thick ITO film was formed from an ITO ceramic target ($In_2O_3$:$SnO_2$=90% by weight:10% by weight) on a surface of a glass substrate by a DC sputtering method to thereby form a transparent electrode (anode).

Then, in the condition that a photo resist was used, ITO was etched to form a pattern having a light-emitting area of 15 mm×15 mm. After ultrasonic Cleaning, ozone cleaning was performed by using a low-pressure ultraviolet lamp.

Then, organic layers were formed successively on the ITO surface by a vacuum vapor deposition method. First, CuPc represented by the formula (3) was deposited at a vapor deposition rate of 0.3 nm/s to form a 15 nm-thick hole injection layer. Next, α-NPD represented by the formula (4) was deposited at a vapor deposition rate of 0.3 nm/s to form a 40 nm-thick hole transport layer. Finally, Alq represented by the formula (5) was deposited at a vapor deposition rate of 0.3 nm/s to form a 140 nm-thick electron transport light-emitting layer.

Then, Mg and Ag were co-deposited at a vapor deposition rate of 1 nm/s and at a vapor deposition rate of 0.1 nm/s respectively to form a 100 nm-thick MgAg layer. From the point of view of inhibiting oxidation of the MgAg layer, a 50 nm-thick Ag layer was further formed on the MgAg layer to thereby form a reflective electrode (cathode).

The resulting cell was taken out of the vacuum vapor deposition apparatus. Then, an ultraviolet-curable epoxy resin was dripped onto the cathode side. Slide glass was put on the epoxy resin. At a point of time when the epoxy resin was spread sufficiently, the epoxy resin was cured by a high-pressure ultraviolet lamp to seal the cell.

[Chemical Formula 1]

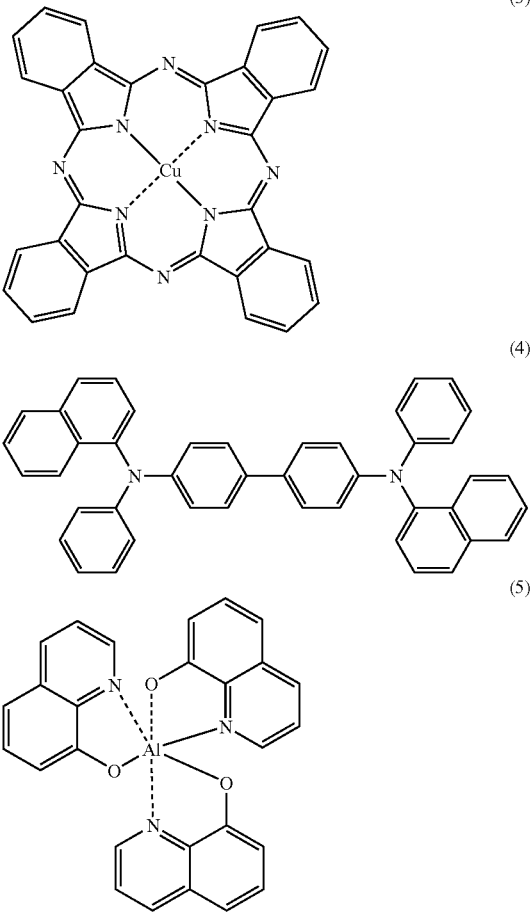

A voltage of 1.5 V was applied to the organic EL cell produced in the aforementioned manner before a region for disturbing the angle of reflection/refraction was formed. As a result, current conduction with a current density of 10.5 mA/cm² occurred in the cell, so that generation of light was observed.

Figure 10:
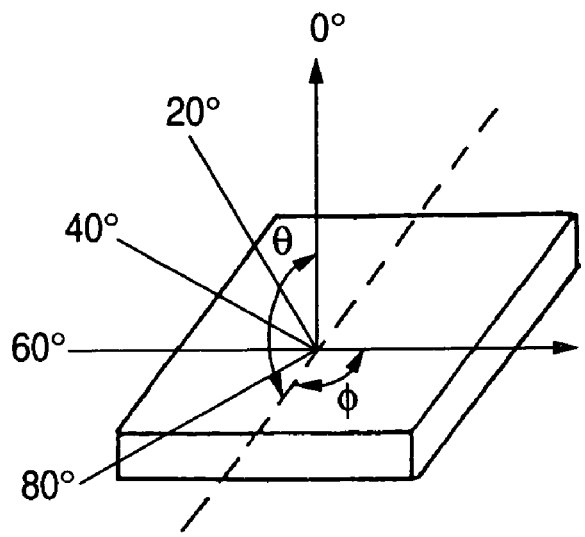
FIG. 10 is a view for explaining the characteristic of the organic electroluminescence cell obtained in Example 1-1.

As shown in FIG. 10, the luminance of the cell in the θ direction was measured at intervals of 10 degrees in a direction range of from 0 degrees to 80 degrees by use of a luminance meter (trade name "BM9" made by Topcon Corp.) available on the market. Results were shown in Table 1-1. While the direction of measurement was changed to a Φ direction, the dependence of the luminance on the angle was measured. As a result, the measured values of luminance were substantially equal in all directions.

Accordingly, the amount (lm/m²) of luminous flux per unit area, output to a space up to the direction of 80 degrees was calculated by numerical integration on the assumption that generated light was evenly distributed with respect to the Φ direction. Results were also shown in Table 1-1.

As shown in Table 1-1, the organic EL cell satisfied the expression (1) of the invention sufficiently. In the cell, hole-electron recombination substantially occurred in the interface between α-NPD and Alq. Accordingly, the distance d between the central portion of the hole-electron recombination light-emitting region and the reflective electrode according to the invention was about 140 nm.

When a black light with an emission wavelength of 365 nm was used as an excitation light source for illuminating an Alq thin film formed on a glass substrate by vapor deposition, the peak wavelength of the fluorescence spectrum was about 530 nm. The refractive index n of the Alq thin film measured with a spectral ellipsometer was about 1.67. Accordingly, the organic EL cell also satisfied the relation given by the expression (2) of the invention.

<Formation of Reflection/Refraction Angle Disturbance Region>

Into 50 g of toluene, 25 g of silicone particles having a refractive index of 1.43 and a particle size of 4 μm were added and stirred well. On the other hand, an acrylic tackiness agent having a refractive index of 1.47 was added and dissolved into toluene to prepare a solution. The solution was added into the silicone particle-dispersed toluene solution so that the ratio of silicone to the tackiness agent became 25% by weight. The mixture solution was stirred well while the ratio of the tackiness agent to toluene was adjusted to be 25% by weight.

The solution prepared in the aforementioned manner was applied on a separator by use of an applicator and dried to thereby produce a light-diffusing tackiness agent 20 μm thick.

Then, ten sheets of the light-diffusing tackiness agent were laminated and stuck onto the glass substrate surface of the orgaic EL cell produced in the aforementioned manner. Thus, a light-diffusing layer about 200 μm thick was formed on the glass substrate surface. Then, a voltage of 15 V was applied to the cell in the same manner as described above so that a current with a current density of 10.5 mA/cm² flew in the cell. In this condition, luminance was measured in an angle range of 0 degrees to 80 degrees. Results of the measurement were also shown in Table 1-1. The amount of luminous flux per unit area was calculated in the same manner as described above. Results of the measurement were also shown in Table 1-1.

TABLE 1-1

| Angle | Luminance value (cd/m²) | |
|---|---|---|
| | Before formation of light-diffusing layer | After formation of light-diffusing layer |
| 0° | 126 | 392 |
| 10° | 138 | 382 |
| 20° | 154 | 382 |
| 30° | 181 | 424 |
| 40° | 225 | 445 |
| 50° | 272 | 466 |
| 60° | 307 | 509 |
| 70° | 386 | 487 |
| 80° | 339 | 466 |
| Total quantity of luminous flux | 761 (lm/m²) | 1374 (lm/m²) |

EXAMPLE 1-2

An organic EL cell as a basic configuration and an organic EL cell including a light-diffusing layer added to the basic configuration were produced in the same manner as in Example 1-1 except that a 120 nm-thick layer of Alq represented by the formula (5) was formed as the electron transport light-emitting layer.

Before and after the formation of the light-diffusing layer, a voltage of 13.1 V was applied to the organic EL cell so that a current with a current density of 10.5 mA/cm² flew in the cell to generate luminescence in the same manner. In this condition, the organic EL cell was evaluated in the same manner as in Example 1-1. Results of the evaluation were shown in Table 1-2. Incidentally, the luminance distribution in the θ direction before the formation of the light-diffusing layer satisfied the relation given by the expression (1) of the invention, and the value of 120 nm as the thickness of the Alg layer also satisfied the relation given by the expression (2) of the invention.

TABLE 1-2

| Angle | Luminance value (cd/m²) | |
|---|---|---|
| | Before formation of light-diffusing layer | After formation of light-diffusing layer |
| 0° | 166 | 426 |
| 10° | 171 | 431 |
| 20° | 176 | 450 |
| 30° | 205 | 460 |
| 40° | 245 | 465 |
| 50° | 284 | 484 |
| 60° | 313 | 499 |
| 70° | 362 | 484 |
| 80° | 342 | 377 |
| Total quantity of luminous flux | 798 (lm/m²) | 1432 (lm/m²) |

COMPARATIVE EXAMPLE 1-1

An organic EL cell as a basic configuration and an organic EL cell including a light-diffusing layer added to the basic configuration were produced in the same manner as in Example 1-1 except that a 60 nm-thick layer of Alq represented by the formula (5) was formed as the electron transport light-emitting layer.

Before and after the formation of the light-diffusing layer, a voltage of 8.2 V was applied to the organic EL cell so that a current with a current density of 10.5 mA/cm² flew in the cell to generate luminescence in the same manner. In this condition, the organic EL cell was evaluated in the same manner as in Example 1-1. Results of the evaluation were shown in Table 1-3. Incidentally, the luminance distribution in the θ direction before the formation of the light-diffusing layer did not satisfy the relation given by the expression (1) of the invention, and the value of 60 nm as the thickness of the Alg layer did not satisfy the relation given by the expression (2) of the invention either.

TABLE 1-3

| Angle | Luminance value (cd/m²) | |
|---|---|---|
| | Before formation of light-diffusing layer | After formation of light-diffusing layer |
| 0° | 323 | 384 |
| 10° | 323 | 384 |
| 20° | 319 | 384 |
| 30° | 315 | 384 |
| 40° | 302 | 360 |
| 50° | 286 | 336 |
| 60° | 269 | 312 |
| 70° | 244 | 265 |
| 80° | 202 | 143 |
| Total quantity of luminous flux | 884 (lm/m²) | 1034 (lm/m²) |

COMPARATIVE EXAMPLE 1-2

An organic EL cell as a basic configuration and an organic EL cell including a light-diffusing layer added to the basic configuration were produced in the same manner as in Example 1-1 except that a 25 nm-thick layer of Alq represented by the formula (5) was formed as the electron transport light-emitting layer.

Before and after the formation of the light-diffusing layer, a voltage of 6.1 V was applied to the organic EL cell so that a current with a current density of 1.0.5 mA/cm² flew in the cell to generate luminescence in the same manner. In this condition, the organic EL cell was evaluated in the same manner as in Example 1-1. Results of the evaluation were shown in Table 1-4. Incidentally, the luminance distribution in the θ direction before the formation of the light-diffusing layer did not satisfy the relation given by the expression (1) of the invention, and the value of 25 nm as the thickness of the Alg layer did not satisfy the relation given by the expression (2) of the invention either.

TABLE 1-4

| Angle | Luminance value (cd/m²) | |
|---|---|---|
| | Before formation of light-diffusing layer | After formation of light-diffusing layer |
| 0° | 123 | 138 |
| 10° | 123 | 138 |
| 20° | 118 | 138 |
| 30° | 114 | 138 |
| 40° | 107 | 137 |
| 50° | 106 | 135 |
| 60° | 102 | 126 |
| 70° | 95 | 116 |
| 80° | 82 | 95 |
| Total quantity of luminous flux | 328 (lm/m²) | 402 (lm/m²) |

COMPARATIVE EXAMPLE 1-3

An organic EL cell as a basic configuration and an organic EL cell including a light-diffusing layer added to the basic configuration were produced in the same manner as in Example 1-1 except that a 180 nm-thick layer of Alq represented by the formula (5) was formed as the electron transport light-emitting layer.

Before and after the formation of the light-diffusing layer, a voltage of 17.3 V was applied to the organic EL cell so that a current with a current density of 10.5 mA/cm² flew in the cell to generate luminescence in the same manner. In this condition, the organic EL cell was evaluated in the same manner as in Example 1-1. Results of the evaluation were shown in Table 1-5. Incidentally, the luminance distribution in the θ direction before the formation of the light-diffusing layer did not satisfy the relation given by the expression (1) of the invention, and the value of 180 nm as the thickness of the Alg layer did not satisfy the relation given by the expression (2) of the invention either.

TABLE 1-5

| | Luminance value (cd/m²) | |
|---|---|---|
| Angle | Before formation of light-diffusing layer | After formation of light-diffusing layer |
| 0° | 154 | 243 |
| 10° | 148 | 240 |
| 20° | 134 | 238 |
| 30° | 116 | 252 |
| 40° | 101 | 267 |
| 50° | 92 | 267 |
| 60° | 95 | 264 |
| 70° | 89 | 243 |
| 80° | 80 | 157 |
| Total quantity of luminous flux | 323 (lm/m²) | 773 (lm/m²) |

COMPARATIVE EXAMPLE 1-4

An organic EL cell as a basic configuration and an organic EL cell including a light-diffusing layer added to the basic configuration were produced in the same manner as in Example 1-1 except that a 220 nm-thick layer of Alq represented by the formula (5) was formed as the electron transport light-emitting layer.

Before and after the formation of the light-diffusing layer, a voltage of 21.2 V was applied to the organic EL cell so that a current with a current density of 10.5 mA/cm² flew in the cell to generate luminescence in the same manner. In this condition, the organic EL cell was evaluated in the same manner as in Example 1-1. Results of the evaluation were shown in Table 1-6. Incidentally, the luminance distribution in the θ direction before the formation of the light-diffusing layer did not satisfy the relation given by the expression (1) of the invention, and the value of 220 nm as the thickness of the Alq layer did not satisfy the relation given by the expression (2) of the invention either.

TABLE 1-6

| | Luminance value (cd/m²) | |
|---|---|---|
| Angle | Before formation of light-diffusing layer | After formation of light-diffusing layer |
| 0° | 363 | 363 |
| 10° | 354 | 367 |
| 20° | 358 | 354 |
| 30° | 341 | 341 |
| 40° | 311 | 320 |
| 50° | 272 | 332 |
| 60° | 225 | 302 |
| 70° | 177 | 263 |
| 80° | 160 | 207 |
| Total quantity of luminous flux | 863 (lm/m²) | 975 (lm/m²) |

The results of Examples 1-1 and 1-2 were collected into Table 1-7.

TABLE 1-7

| | Example 1-1 | Example 1-2 |
|---|---|---|
| Thickness of Alq layer (nm) | 140 | 120 |
| Frontal luminance (cd/m²) | | |
| Before formation of light-diffusing layer | 126 | 166 |
| After formation of light-diffusing layer | 392 | 426 |
| Rate of increase in luminance | 3.11 | 2.56 |
| Total quantity of luminous flux (lm/m²) | | |
| Before formation of light-diffusing layer | 761 | 798 |
| After formation of light-diffusing layer | 1374 | 1432 |
| Rate of increase in quantity of luminous flux | 1.81 | 1.79 |

The results of Comparative Examples 1-1 to 1-4 were collected into Table 1-8.

TABLE 1-8

| | Comparative Example 1-1 | Comparative Example 1-2 | Comparative Example 1-3 | Comparative Example 1-4 |
|---|---|---|---|---|
| Thickness of Alq Layer (nm) | 60 | 25 | 180 | 220 |
| Frontal luminance (cd/m²) | | | | |
| Before formation of light-diffusing layer | 323 | 123 | 154 | 363 |
| After formation of light-diffusing layer | 384 | 138 | 243 | 363 |
| Rate of increse in luminance | 1.19 | 1.13 | 1.58 | 1.00 |
| Total quantity of luminous flux (lm/m²) | | | | |
| Before formation of light-diffusing layer | 884 | 328 | 323 | 863 |

TABLE 1-8-continued

|  | Comparative Example 1-1 | Comparative Example 1-2 | Comparative Example 1-3 | Comparative Example 1-4 |
|---|---|---|---|---|
| After formation of light-diffusing layer | 1034 | 402 | 773 | 975 |
| Rate of increase in quantity of luminous flux | 1.17 | 1.23 | 2.39 | 1.13 |

As is obvious from the results, in the organic EL cell obtained in each of Examples 1-1 and 1-2 according to the invention, both luminance and total amount of luminous flux exhibit small values before the formation of the light-diffusing layer, but both frontal luminance and total amount of luminous flux increase largely after the formation of the light-diffusing layer. In comparison in the condition that the same current flows in the cell, it is obvious that an organic EL cell higher in efficiency than the organic EL cell obtained in any one of Comparative Examples 1-1 to 1-4 can be obtained in each of Examples 1-1 and 1-2.

EXAMPLE 1-3

Into 10 g of toluene, 1.5 g of silicone particles having a refractive index of 1.43 and a particle size of 4 μm were added and stirred well. On the other hand, a polymethyl methacrylate (PMMA) resin was added and dissolved into toluene to prepare a solution containing 20% by weight of PMMA. The solution was added into the silicone particle-dispersed toluene solution so that the ratio of silicone to PbMA became 15% by weight. The mixture solution was stirred well while the ratio of PMMA to toluene was adjusted to be 20% by weight.

Then, the prepared solution was applied on a glass substrate by use of an applicator so that the glass substrate was coated with the PMMA layer about 200 μm thick. Thus, a light-diffusing layer was formed.

A 50 nm-thick layer of $SiO_2$ was formed on the light-diffusing layer of the glass substrate by a reactive sputtering method in the condition that an Si target was used in an atmosphere of mixture of an argon gas and an oxygen gas. Then, a 100 nm-thick ITO film was formed on a surface of the $SiO_2$ layer in the same manner as in Example 1-1. Thus, a transparent electrode (anode) was produced.

Then, in the condition that a photo resist was used, the ITO film was etched to form a pattern having a light-emitting area of 15 mm×15 mm. After ultrasonic cleaning, ozone cleaning was performed by use of a low-pressure ultraviolet lamp Then, organic layers were formed successively on the ITO surface by a vacuum vapor deposition method as follows. First, a 15 nm-thick layer of CuPc represented by the formula (3) was formed as a hole injection layer at a vapor deposition rate of 0.3 nm/s. Then, a 40 nm-thick layer of α-NPD represented by the formula (4) was formed as a hole transport layer at a vapor deposition rate of 0.3 nm/s. Finally, a 140 nm-thick layer of Alq represented by the formula (5) was formed as an electron transport light-emitting layer at a vapor deposition rate of 0.3 nm/s.

Then, Mg and Ag vapors were co-deposited at vapor deposition rates of 1 nm/s and 0.1 nm/s respectively to form a 100 nm-thick layer of MgAg. Then, from the point of view of preventing oxidation of MgAg, a 50 nm-thick layer of Ag was formed on the MgAg layer. Thus, a reflective electrode (cathode) was produced.

After the cell was taken out of the vacuum vapor deposition apparatus, an ultraviolet-curable epoxy resin was dripped onto the cathode side. A sheet of slide glass was put on the epoxy resin. At a point of time when the epoxy resin was spread sufficiently, the epoxy resin was cured by a high-pressure ultraviolet lamp to seal the cell.

When the organic EL cell produced in this manner was supplied with a voltage of 15 V, a current with a current density of 10.5 mA/cm² flew in the cell, so that generation of luminescence was observed. In this case, frontal luminance was 418 (cd/m²), and the total amount of luminous flux was 1492 (lm/mn²). It was confirmed from the results that the effect of the invention can be obtained sufficiently when the reflection/refraction angle disturbance region is provided in addition to the basic configuration of the cell so that the angular distribution in the θ direction before the formation of the light-diffusing layer satisfies the relation given by the expression (1) and that the basic configuration per se of the cell satisfies the relation given by the expression (2).

EXAMPLE 1-4

An organic EL cell was produced in the same manner as in Example 1-1 except that the light-diffusing tackiness agent used as the reflection/refraction angle disturbance region in Example 1-1 was replaced by a cube corner lens sheet having a large number of triangular pyramids arranged and that the cube corner lens sheet was stuck onto a surface of the glass substrate of the organic EL cell through a transparent tackiness agent.

COMPARATIVE EXAMPLE 1-5

An organic EL cell was produced in the same manner as in Example 1-4 except that a 60 nm-thick layer of Alq represented by the formula (5) was formed as an electron transport light-emitting layer.

The total amount of luminous flux in the organic EL cell obtained in each of Example 1-4 and Comparative Example 1-5 was measured in the same manner as described above. As a result, the total amount of luminous flux in the organic EL cell obtained in Example 1-4 was 1792 (lm/m²) whereas the total amount of luminous flux in the organic EL cell obtained in Comparative Example 1-5 was 1308 (lm/m²). It was confirmed that light-emitting efficiency can be improved when the organic EL cell according to the invention is used.

EXAMPLE 1-5

An ITO film was formed on a surface of a glass substrate in the same manner as in Example 1-1. After ultrasonic cleaning, ozone cleaning was performed by use of a low-pressure ultraviolet lamp.

Then, a PEDOT/PSS solution ("BAYTRON P AI 4083" made by Bayer AG) represented by the formula (6) was applied onto the ITO surface by a spin coating method at a rotational speed of 4000 rpm to thereby form a 30 nm-thick layer as a hole injection layer. After the resulting substrate was dried at 120° C. for 2 hours, an organic EL layer was formed on the substrate as follows by referring to the document (Mori et al. "Applied Physics", Vol. 61, No. 10, p. 1044, 1992).

First, 0.12 g of PVK represented by the formula (7) as a hole transport matrix polymer, 0.0514 g of BND represented by the formula (8) as an electron transport material and 0.0006 g of coumarin-6 represented by the formula (9) as a luminous material were added into 9.88 g of 1,1,2,2-tetrachloroethane as a solvent and dissolved/mixed well to prepare a coating solution. Then, the coating solution was applied onto the hole injection layer by a spin coating method at a rotational speed of 750 rpm to thereby form a 150 nm-thick organic EL layer.

After the organic EL layer was then dried at 70° C. for an hour, an MgAg/Ag electrode was formed on the organic EL layer by a vacuum vapor deposition apparatus in the same manner as in Example 1-1. After taken out of the vacuum vapor deposition apparatus, the cell was sealed. The light-emitting area was set at 15 mm×15 mm on the basis of masking at the time of vapor deposition of the electrode.

[Chemical Formulae 2]

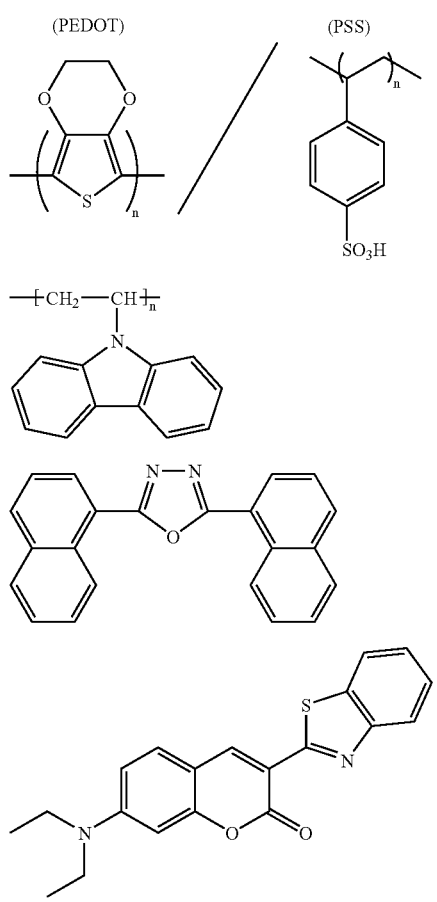

When the organic EL cell produced in this manner, that is, the organic EL cell before the formation of the reflection/refraction angle disturbance region, was supplied with a voltage of 21 V, a current with a current density of 20 mA/cm$^2$ flew in the cell, so that generation of green luminescence from coumarin-6 was observed. Luminance in this case was measured at intervals of 10 degrees in a direction range of from 0 degrees to 80 degrees in the same manner as in Example 1-1. The amount of luminous flux per unit area was also calculated in the same manner as in Example 1-1.

Then, ten sheets of the light-diffusing tackiness agent used in Example 1-1 were stuck onto a surface of the glass substrate of the organic EL cell as the basic configuration to thereby form a light-diffusing layer about 200 μm thick. Then, a voltage of 21 V was applied to the cell so that a current with a current density of 20 mA/cm$^2$ flew in the cell in the same manner as described above. In this condition, luminance was measured. The amount of luminous flux per unit area was also calculated.

Results of the measurement and calculation were as shown in Table 1-9.

TABLE 1-9

| Angle | Luminance value (cd/m$^2$) | |
| --- | --- | --- |
| | Before formation of light-diffusing layer | After formation of light-diffusing layer |
| 0° | 183 | 351 |
| 10° | 183 | 351 |
| 20° | 183 | 351 |
| 30° | 189 | 347 |
| 40° | 196 | 344 |
| 50° | 215 | 330 |
| 60° | 227 | 315 |
| 70° | 233 | 287 |
| 80° | 202 | 222 |
| Total quantity of luminous flux | 628 (lm/m$^2$) | 1002 (lm/m$^2$) |

COMPARATIVE EXAMPLE 1-6

An organic EL cell as a basic configuration before formation of a reflection/refraction angle disturbance region and an organic EL cell after formation of a light-diffusing layer in addition to the basic configuration were produced in the same manner as in Example 1-5 except that the rotational speed used at the time of formation of the organic EL layer was 2500 rpm and that the thickness of the organic EL layer was 75 nm.

Before and after the formation of the light-diffusing layer, the organic EL cell was supplied with a voltage of 12.7 V so that a current with a current density of 20 mA/cm$^2$ flew in the cell so as to generate luminescence in the same manner as in Example 1-5. In this condition, the organic EL cell was evaluated in the same manner as in Example 1-5. Results of the evaluation were as shown in Table 1-10.

TABLE 1-10

| Angle | Luminance value (cd/m$^2$) | |
| --- | --- | --- |
| | Before formation of light-diffusing layer | After formation of light-diffusing layer |
| 0° | 236 | 291 |
| 10° | 236 | 291 |
| 20° | 236 | 289 |
| 30° | 233 | 288 |
| 40° | 230 | 286 |
| 50° | 227 | 284 |

TABLE 1-10-continued

| | Luminance value (cd/m²) | |
|---|---|---|
| Angle | Before formation of light-diffusing layer | After formation of light-diffusing layer |
| 60° | 217 | 263 |
| 70° | 205 | 229 |
| 80° | 174 | 180 |
| Total quantity of luminous flux | 658 (lm/m²) | 833 (lm/m²) |

As is obvious from the results, in the organic EL cell obtained in Example 1-5 according to the invention, the luminance distribution before the formation of the light-diffusing layer satisfies the expression (1) of the invention. As a result, the total amount of luminous flux is increased to about 1.6 times when the light-diffusing layer is formed. On the contrary, in the organic EL cell obtained in Comparative Example 1-6, the luminance distribution before the formation of the light-diffusing layer does not satisfy the expression (1) of the invention though only frontal luminance is higher than that of the cell obtained in Example 1-5. As a result, the rate of increase in the total amount of luminous flux is about 1.2 times. The organic EL cell obtained in Comparative Example 1-6 lacks the guided light extracting effect based on the formation of the light-diffusing layer.

EXAMPLE 2

Next, the invention will be described specifically on the basis of the following Examples 2-1 to 2-3 each using a polarizing/scattering site provided as the reflection/refraction angle disturbance region in the organic EL cell according to the invention, in comparison with Comparative Examples 2-1 to 2-6 and Reference Examples 2-1 and 2-2.

EXAMPLE 2-1

An organic EL cell before formation of a reflection/refraction angle disturbance region, that is, an organic EL cell as a basic configuration having a 140 nm-thick electron transport light-emitting layer (of Alq represented by the formula (5)) and satisfying the relations given by the expressions (1) and (2) of the invention, was produced in the same manner as in Example 1-1.

Then, a film formed as a polarizing/scattering site by the following method was stuck onto the glass substrate of the organic EL cell as the basic configuration through an acrylic tackiness agent to thereby form a reflection/refraction angle disturbance region.

Then, in the condition that a voltage of 15 V was applied to the organic EL cell so that a current with a current density of 10.5 mA/cm² flew in the cell, frontal luminance was measured in the same manner as in Example 1-1.

After a polarizer ("NPF-SEG1425DU" made by Nitto Denko Corp.) was placed on the polarizing/scattering site so that the stretching direction of the polarizing/scattering site and the transmission axis of the polarizer were parallel with each other, frontal luminance was measured in the same manner as described above.

<Formation of Polarizing/Scattering Site>

A 100 μm-thick film was formed by a casting method using a solution of 20% by weight of dichloromethane in which 950 parts by weight of a norbornene resin ("ARTON" made by JSR Corp., glass transition temperature: 182° C.) and 50 parts by weight of a liquid crystal polymer (glass transition temperature: 80° C., nematic liquid crystallization temperature: 100° C. to 290° C.) expressed by the following formula (10) were dissolved. The film was stretched to three times at 180° C. and then cooled rapidly. Thus, a film used as a polarizing/scattering site was prepared.

In the film as the polarizing/scattering site, approximately isomorphic micro domains of the liquid crystal polymer were dispersed in the transparent film of the norbornene resin so that major axes of the micro domains were arranged in the stretching direction. The refractive index difference $\Delta n_1$ was 0.23. Each of the refractive index differences $\Delta n_2$ and $\Delta n_3$ was 0.029. The average size of the micro domains was measured by examination of coloring based on the retardation with a polarizing microscope. As a result, the length in the $\Delta n_1$ direction was about 5 μm.

[Chemical Formula 3]

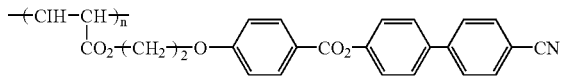

(10)

EXAMPLE 2-2

An organic EL cell before formation of a reflection/refraction angle disturbance region, that is, an organic EL cell as a basic configuration having a 120 nm-thick electron transport light-emitting layer (of Alq represented by the formula (5)) and satisfying the relations given by the expressions (1) and (2) of the invention, was produced in the same manner as in Example 1-2.

Then, the film formed as a polarizing/scattering site in Example 2-1 was stuck onto the glass substrate of the organic EL cell as the basic configuration through an acrylic tackiness agent to thereby form a reflection/refraction angle disturbance region.

Then, in the condition that a voltage of 13.1 V was applied to the organic EL cell so that a current with a current density of 10.5 mA/cm² flew in the cell, frontal luminance was measured in the same manner as in Example 1-2. After a polarizer ("NPF-SEG1425DU" made by Nitto Denko Corp.) was placed on the polarizing/scattering site so that the stretching direction of the polarizing/scattering site and the transmission axis of the polarizer were parallel with each other, frontal luminance was measured in the same manner as described above.

COMPARATIVE EXAMPLE 2-1

An organic EL cell as a basic configuration before formation of a reflection/refraction angle disturbance region was produced in the same manner as in Example 1-1 except that the thickness of the electron transport light-emitting layer of Alq represented by the formula (5) was set at 65 nm. In the condition that a voltage of 8.8 V was applied to the cell so that a current with a current density of 10.5 mA/cm² flew in the cell to generate luminescence, luminance was evaluated in the same manner as in Example 1-1.

As a result, the measured values of luminance were 314 cd/m² at 0°, 315 cd/m² at 10°, 312 cd/m² at 20°, 309 cd/m² at 30°, 298 cd/m² at 40°, 285 cd/m² at 50°, 274 cd/m² at 60°, 257 cd/m² at 70°, and 229 cd/m² at 80°.

Accordingly, the luminance distribution in the θ direction did not satisfy the relation given by the expression (1) of the invention, and the value of 65 nm as the thickness of the Alq layer did not satisfy the relation given by the expression (2) of the invention.

Then, the film formed as a polarizing/scattering site in Example 2-1 was stuck, through an acrylic tackiness agent, onto the glass substrate of the organic EL cell as the basic configuration produced in the aforementioned manner. In the condition that a voltage of 8.8 V was applied to the organic EL cell so that a current with a current density of 10.5 mA/cm$^2$ flew in the cell, frontal luminance was measured in the same manner as described above.

After a polarizer ("NPF-SEG1425DU" made by Nitto Denko Corp.) was placed on the polarizing/scattering site so that the stretching direction of the polarizing/scattering site and the transmission axis of the polarizer were parallel with each other, frontal luminance was measured in the same manner as described above.

COMPARATIVE EXAMPLE 2-2

An organic EL cell before formation of a reflection/refraction angle disturbance region, that is, an organic EL cell as a basic configuration having a 25 nm-thick electron transport light-emitting layer (of Alq represented by the formula (5)) but not satisfying the relations given by the expressions (1) and (2) of the invention, was produced in the same manner as in Comparative Example 1-2.

Then, the film formed as a polarizing/scattering site in Example 2-1 was stuck onto the glass substrate of the organic EL cell as the basic configuration through an acrylic tackiness agent to thereby form a reflection/refraction angle disturbance region.

Then, in the condition that a voltage of 6.1 V was applied to the organic EL cell so that a current with a current density of 10.5 mA/cm$^2$ flew in the cell, frontal luminance was measured in the same manner as in Comparative Example 1-2.

After a polarizer ("NPF-SEG1425DU" made by Nitto Denko Corp.) was placed on the polarizing/scattering site so that the stretching direction of the polarizing/scattering site and the transmission axis of the polarizer were parallel with each other, frontal luminance was measured in the same manner as described above.

COMPARATIVE EXAMPLE 2-3

An organic EL cell before formation of a reflection/refraction angle disturbance region, that is, an organic EL cell as a basic configuration having a 180 nm-thick electron transport light-emitting layer (of Alq represented by the formula (5)) but not satisfying the relations given by the expressions (1) and (2) of the invention, was produced in the same manner as in Comparative Example 1-3.

Then, the film formed as a polarizing/scattering site in Example 2-1 was stuck onto the glass substrate of the organic EL cell as the basic configuration through an acrylic tackiness agent to thereby form a reflection/refraction angle disturbance region.

Then, in the condition that a voltage of 17.3 V was applied to the organic EL cell so that a current with a current density of 10.5 mA/cm$^2$ flew in the cell, frontal luminance was measured in the same manner as in Comparative Example 1-3. After a polarizer ("NPF-SEG1425DU" made by Nitto Denko Corp.) was placed on the polarizing/scattering site so that the stretching direction of the polarizing/scattering site and the transmission axis of the polarizer were parallel with each other, frontal luminance was measured in the same manner as described above.

COMPARATIVE EXAMPLE 2-4

An organic EL cell before formation of a reflection/refraction angle disturbance region, that is, an organic EL cell as a basic configuration having a 220 nm-thick electron transport light-emitting layer (of Alq represented by the formula (5)) but not satisfying the relations given by the expressions (1) and (2) of the invention, was produced in the same manner as in Comparative Example 1-4.

Then, the film formed as a polarizing/scattering site in Example 2-1 was stuck onto the glass substrate of the organic EL cell as the basic configuration through an acrylic tackiness agent to thereby form a reflection/refraction angle disturbance region.

Then, in the condition that a voltage of 21.2 V was applied to the organic EL cell so that a current with a current density of 10.5 mA/cm$^2$ flew in the cell, frontal luminance was measured in the same manner as in Comparative Example 1-4. After a polarizer ("NPF-SEG1425DU" made by Nitto Denko Corp.) was placed on the polarizing/scattering site so that the stretching direction of the polarizing/scattering site and the transmission axis of the polarizer were parallel with each other, frontal luminance was measured in the same manner as described above.

COMPARATIVE EXAMPLE 2-5

A general diffusing film containing micro domains exhibiting no birefringence was produced by the following method. The general diffusing film as a substitute for the film formed as a polarizing/scattering side in Example 2-1 was stuck, through an acrylic tackiness agent, onto the glass substrate of the organic EL cell which was produced in Example 2-1 as a basic configuration before formation of a reflection/refraction angle disturbance region.

Then, in the condition that a voltage of 15 V was applied to the organic EL cell so that a current with a current density of 10.5 mA/cm$^2$ flew in the cell, frontal luminance was measured in the same manner as described above.

After a polarizer ("NPF-SEG1425DU" made by Nitto Denko Corp.) was placed on the general diffusing film, frontal luminance was measured in the same manner as described above.

<Production of General Diffusing Film>

Into 10 g of toluene, 1.5 g of silicone particles having a refractive index of 1.43 and a particle size of 4 μm were added and stirred well. On the other hand, a polymethyl methacrylate (PMMA) resin was added and dissolved into toluene to prepare a solution containing 20% by weight of PMMA. The solution was added to the silicone particle-dispersed toluene solution so that the ratio of silicone to PMMA was set at 15% by weight. The mixture solution was stirred well while the ratio of PMMA to toluene was adjusted to be 20% by weight. Then, the resulting solution was applied onto a glass substrate by an applicator so that the glass substrate was coated with a PMMA layer about 200 μm thick. After dried, the PMMA layer was separated from the glass substrate to thereby obtain a diffusing film.

REFERENCE EXAMPLE 2-1

In the condition that a polarizer was placed directly on the glass substrate of the organic EL cell produced as a basic configuration in Example 2-1, frontal luminance was measured.

REFERENCE EXAMPLE 2-2

In the condition that a polarizer was placed directly on the glass substrate of the organic EL cell produced as a basic configuration in Comparative Example 2-1, frontal luminance was measured.

Results of Examples 2-1 and 2-2, Comparative Examples 2-1 to 2-5 and Reference Examples 2-1 and 2-2 were collectively shown in Table 2. The rate of increase in luminance in each example was also shown in Table 2 on the assumption that the value of frontal luminance at the time of placing the polarizer as shown in Reference Example 2-2 was a reference value (1.00). When the rate of increase in luminance was smaller than 1.00, what was meant by the rate was not increase but decrease in frontal luminance.

the formation of the light-diffusing layer compared with the organic EL cell obtained in Example 2-1, but finally exhibits low frontal luminance compared with the organic EL cell obtained in Example 2-1 because output light in Comparative Example 2-5 is such non-polarized natural light that a half or more of the light is absorbed to the polarizer. The organic EL cell obtained in each of Comparative Examples 2-1 to 2-4 is low in the rate of increase in luminance after the formation of the light-diffusing layer and finally exhibits still low luminance compared with the organic EL cell obtained in Example 2-1.

EXAMPLE 2-3

The film formed as a polarizing/scattering site in Example 2-1, in place of the light-diffusing layer formed by sticking ten sheets of the diffusing tackiness agent, was stuck through an acrylic tackiness agent onto a surface of the glass substrate of the organic EL cell produced as a basic configuration in Example 1-5. Thus, an organic EL cell was produced.

TABLE 2

| | Thickness of Alq layer (nm) | Kind of light-diffusing layer | Frontal luminance (cd/m$^2$) | | | Rate of increase in luminance |
|---|---|---|---|---|---|---|
| | | | Before formation of light-diffusing layer | After formation of light-diffusing layer | After setting of polarizer | |
| Reference Example 2-1 | 140 | None | 126 | — | 58 | 0.40 |
| Reference Example 2-2 | 65 | None | 314 | — | 145 | 1.00 |
| Example 2-1 | 140 | Polarizing/scattering film | 126 | 358 | 261 | 1.80 |
| Example 2-2 | 120 | Polarizing/scattering film | 166 | 388 | 276 | 1.90 |
| Comparative Example 2-1 | 65 | Polarizing/scattering film | 314 | 340 | 197 | 1.36 |
| Comparative Example 2-2 | 25 | Polarizing/scattering film | 123 | 126 | 67 | 0.46 |
| Comparative Example 2-3 | 180 | Polarizing/scattering film | 154 | 222 | 131 | 0.90 |
| Comparative Example 2-4 | 220 | Polarizing/scattering film | 363 | 331 | 179 | 1.23 |
| Comparative Example 2-5 | 140 | Diffusing film | 126 | 422 | 194 | 1.34 |

As is obvious from the results, the organic EL cell obtained in each of Examples 2-1 and 2-2 according to the invention exhibits low frontal luminance before the polarizing/scattering film is stuck to the cell, for example, compared with the organic EL cell obtained in Reference Example 2-2, but exhibits greatly increased frontal luminance after the polarizing/scattering film is stuck to the cell. As is also obvious from frontal luminance after setting of the polarizer, absorption to the polarizer is so low that reduction in luminance is finally minimized because output light rich in its linearly polarized light component is obtained.

On the contrary, the organic EL cell obtained in Comparative Example 2-5 exhibits high frontal luminance after Then, a polarizer was placed on the polarizing/scattering site of the organic EL cell produced in this manner so that the stretching direction of the polarizing/scattering site of the organic EL cell and the transmission axis of the polarizer were parallel with each other. Then, in the condition that a voltage of 21 V was applied to the cell to drive the cell at a current density of 20 mA/cm$^2$ frontal luminance was measured. As a result, luminance of 229 cd/m$^2$ was obtained.

COMPARATIVE EXAMPLE 2-6

The film formed as a polarizing/scattering site in Example 2-1, in place of the light-diffusing layer formed by sticking ten sheets of the diffusing tackiness agent, was stuck through an acrylic tackiness agent onto a surface of the glass substrate of the organic EL cell produced as a basic configuration in Example 1-6. Thus, an organic EL cell was produced.

Then, a polarizer was placed on the polarizing/scattering site of the organic EL cell produced in this manner so that the stretching direction of the polarizing/scattering site of the organic EL cell and the transmission axis of the polarizer were parallel with each other. Then, in the condition that a voltage of 12.7 V was applied to the cell to drive the cell at a current density of 20 mA/cm$^2$, frontal luminance was measured. As a result, luminance of 158 cd/m$^2$ was obtained.

In comparison between Example 2-3 and Comparative Example 2-6, luminance obtained in the cell at the same current density was improved by about 1.4 times. If the same polarizer is placed on the cell obtained in Example 1-5, frontal luminance of the cell is reduced from 351 cd/m$^2$ to 161 cd/m$^2$ because of absorption to the polarizer. However, when the polarizing/scattering site according to the invention is used as the diffusing layer, guided light can be extracted as polarized light rich in its linearly polarized light component. Accordingly, when the cell is used as a backlight unit for a liquid crystal display device, the light-emitting efficiency can be further improved by 1.4 times. That is, it was confirmed that when the cell is used as a backlight unit for a liquid crystal display device, the luminance obtained in the synergy between the function of intensifying guided light and taking out the guided light and the function of outputting polarized light in the invention can be improved by about twice compared with the related art.

Incidentally, also when a reflection type polarizing element is placed on the cell for applying the cell to a backlight unit for a liquid crystal display device, absorption to the polarizer can be reduced to thereby improve luminance. This thing will become obvious from results of the following Example 3.

EXAMPLE 3

The invention will be described specifically in connection with the following description of Examples 3-1 to 3-4 of the organic EL cell according to the invention using a light-diffusing tackiness agent as a reflection/refraction angle disturbance region and further using a reflection type polarizing element, in comparison with Comparative Examples 3-1 to 3-10.

EXAMPLE 3-1

An organic EL cell before formation of a reflection/refraction angle disturbance region, that is, an organic EL cell as a basic configuration having a 140 nm-thick electron transport light-emitting layer (of Alq. represented by the formula (5)) and satisfying the relations given by the expressions (1) and (2) of the invention, was produced in the same manner as in Example 1-1.

Then, ten sheets of a light-diffusing tackiness agent formed as a reflection/refraction angle disturbance region by the following method were stuck onto the glass substrate of the organic EL cell as the basic configuration to thereby form a light-diffusing layer about 200 μm thick. A reflection type polarizing element formed by the following method was further stuck onto the light-diffusing layer. Thus, an organic EL cell was produced.

<Formation of Light-Diffusing Tackiness Agent>

Into 10 g of toluene, 1.5 g of silicone particles having a refractive index of 1.43 and a particle size of 4 μm were added and stirred well. On the other hand, an acrylic tackiness agent having a refractive index of 1.47 was added and dissolved into toluene to prepare a solution containing 20% by weight of the acrylic tackiness agent. The solution was mixed with the silicone particle-dispersed toluene solution so that the ratio of silicone to the tackiness agent was set at 15% by weight. The mixture solution was stirred well while the ratio of the tackiness agent to toluene was adjusted to be 20% by weight. The prepared solution was applied onto a separator by an applicator and dried to thereby produce a light-diffusing tackiness agent 20 μm thick.

<Formation of Reflection Type Polarizing Element>

Four kinds of cholesteric liquid crystal polymer layers exhibiting circular dichroism in wavelength ranges of (A) from 350 nm to 450 nm, (B) from 450 nm to 550 nm, (C) from 600 nm to 700 nm and (D) from 750 nm to 850 nm, respectively, and specularly reflecting right-handed circularly polarized light were prepared as follows. That is, a 0.1 μm-thick polyvinyl alcohol layer was provided on a 50 μm-thick cellulose triacetate film exhibiting no birefringence. The film was rubbed with rayon cloth to form an oriented film. A tetrahydrofuran solution containing 20% by weight of an acrylic thermotropic cholesteric liquid crystal polymer was applied onto the oriented film by a wire bar. After dried, the film was heated at 150° C.±2° C. for 5 minutes so that the cholesteric liquid crystal polymer was oriented. Then, the film was naturally cooled to room temperature to thereby form a 1 μm-thick cholesteric liquid crystal polymer. In this manner, the four kinds of cholesteric liquid crystal polymer layers (A) to (D) were prepared.

Then, while respective liquid crystal surfaces of the cholesteric liquid crystal polymers (A) and (B) were brought into contact with each other, the cholesteric liquid crystal polymers (A) and (B) were thermo-compression-bonded to each other at 150° C.±2° C. for 2 minutes. Then, the cellulose triacetate film on the (B) side was separated from the resulting sheet. While a liquid crystal surface of the cholesteric liquid crystal polymer (C) was brought into contact with an exposed surface of the liquid crystal polymer layer of the resulting sheet, the cholesteric liquid crystal polymer (C) was thermo-compression-bonded to the exposed surface at 150° C.±2° C. for 2 minutes. The liquid crystal polymer (D) was further thermo-compression-bonded in the same manner as described above. Thus, a reflection type polarizing element composed of the cholesteric liquid crystal layers and exhibiting circular dichroism in a wavelength range of from 400 nm to 800 nm due to change in helical pitch in the direction of thickness was obtained.

EXAMPLE 3-2

An organic EL cell before formation of a reflection/refraction angle disturbance region, that is, an organic EL cell as a basic configuration having a 120 nm-thick electron transport light-emitting layer (of Alq represented by the formula (5)) and satisfying the relations given by the expressions (1) and (2) of the invention, was produced in the same manner as in Example 1-2.

Then, a light-diffusing layer about 200 μm thick was formed as a reflection/refraction angle disturbance region on the glass substrate of the organic EL cell as the basic configuration in the same manner as in Example 3-1. A reflection type polarizing element was further stuck onto the light-diffusing layer in the same manner as in Example 3-1. Thus, an organic EL cell was produced.

COMPARATIVE EXAMPLE 3-1

An organic EL cell as a basic configuration before formation of a reflection/refraction angle disturbance region was produced in the same manner as in Example 1-1 except that the thickness of the electron transport light-emitting layer of Alq represented by the formula (5) was set at 65 nm. In the condition that a voltage of 8.8 V was applied to the cell so that a current with a current density of 10.5 mA/cm² flew in the cell to generate luminescence, luminance was evaluated in the same manner as in Example 1-1. As a result, the measured values of luminance were 314 cd/m² at 0°, 315 cd/m² at 10°, 312 cd/m² at 20°, 309 cd/m² at 30°, 298 cd/m² at 40°, 285 cd/m² at 50°, 274 cd/m² at 60°, 257 cd/m² at 70°, and 229 cd/m² at 80°.

From the results, the luminance distribution in the basic configuration before formation of the reflection/refraction angle disturbance region did not satisfy the relation given by the expression (1) of the invention, and the value of 65 nm as the thickness of the Alq layer did not satisfy the relation given by the expression (2) of the invention.

Then, a light-diffusing layer about 200 μm thick was formed as a reflection/refraction angle disturbance region on the glass substrate of the organic EL cell as the basic configuration in the same manner as in Example 3-1. A reflection type polarizing element was further stuck onto the light-diffusing layer in the same manner as in Example 3-1. Thus, an organic EL cell was produced.

COMPARATIVE EXAMPLE 3-2

An organic EL cell before formation of a reflection/refraction angle disturbance region, that is, an organic EL cell as a basic configuration having a 25 nm-thick electron transport light-emitting layer (of Alq represented by the formula (5)) but not satisfying the relations given by the expressions (1) and (2) of the invention, was produced in the same manner as in Comparative Example 1-2.

Then, a light-diffusing layer about 200 μm thick was formed as a reflection/refraction angle disturbance region on the glass substrate of the organic EL cell as the basic configuration in the same manner as in Example 3-1. A reflection type polarizing element was further stuck onto the light-diffusing layer in the same manner as in Example 3-1. Thus, an organic EL cell was produced.

COMPARATIVE EXAMPLE 3-3

An organic EL cell before formation of a reflection/refraction angle disturbance region, that is, an organic EL cell as a basic configuration having a 180 nm-thick electron transport light-emitting layer (of Alq represented by the formula (5)) but not satisfying the relations given by the expressions (1) and (2) of the invention, was produced in the same manner as in Comparative Example 1-3.

Then, a light-diffusing layer about 200 μm thick was formed as a reflection/refraction angle disturbance region on the glass substrate of the organic EL cell as the basic configuration in the same manner as in Example 3-1. A reflection type polarizing element was further stuck onto the light-diffusing layer in the same manner as in Example 3-1. Thus, an organic EL cell was produced.

COMPARATIVE EXAMPLE 3-4

An organic EL cell before formation of a reflection/refraction angle disturbance region, that is; an organic EL cell as a basic configuration having a 220 nm-thick electron transport light-emitting layer (of Alq represented by the formula (5)) but not satisfying the relations given by the expressions (1) and (2) of the invention, was produced in the same manner as in Comparative Example 1-4.

Then, a light-diffusing layer about 200 μm thick was formed as a reflection/refraction angle disturbance region on the glass substrate of the organic EL cell as the basic configuration in the same manner as in Example 3-1. A reflection type polarizing element was further stuck onto the light-diffusing layer in the same manner as in Example 3-1. Thus, an organic EL cell was produced.

The organic EL cell obtained in each of Examples 3-1 and 3-2 and Comparative Examples 3-1 to 3-4 was subjected to a performance test by the following method on the assumption that the cell was used as a backlight unit for a liquid crystal display device. Results of the test were as shown in Table 3-1.

<Performance Test of Organic EL Cell>

An absorption type polarizer "NPF-HEG1425DU" made by Nitto Denko Corp. was used. The absorption type polarizer was 180 μm thick. A norbornone resin film ("ARTON" made by JSR Corp.) was stretched (vertically uniaxially stretched) to 1.5 times at 180° C. so as to be adjusted as a quarter-wave plate (λ/4-wave plate) with Δnd=135 nm at wavelength λ=550 nm. The quarter-wave plate was 90 μm thick.

The absorption type polarizer and the quarter-wave plate were bonded to each other by an acrylic tackiness agent so that an angle of 45° was formed between the absorption axis of the absorption type polarizer and the stretching axis of the quarter-wave plate.

The quarter-wave plate-including polarizer obtained in this manner was placed on an emission surface of each organic EL cell. A predetermined voltage was applied to each cell so that a current of 10.5 mA flew in each cell. In this condition, frontal luminance was measured. Light-emitting efficiency (cd/A) was also measured.

TABLE 3-1

| | Thickness of Alq layer (nm) | Current density (mA/cm²) | Frontal luminance (cd/m²) | Light-emitting efficiency (cd/A) |
|---|---|---|---|---|
| Example 3-1 | 140 | 10.5 | 323 | 3.08 |
| Example 3-2 | 120 | 10.5 | 337 | 3.21 |
| Comparative Example 3-1 | 65 | 10.5 | 235 | 2.24 |
| Comparative Example 3-2 | 25 | 10.5 | 73 | 0.70 |
| Comparative Example 3-3 | 180 | 10.5 | 156 | 1.49 |
| Comparative Example 3-4 | 220 | 10.5 | 216 | 2.06 |

As is obvious from results of Table 3-1, the organic EL cell obtained in each of Examples 3-1 and 3-2 according to the invention is higher in frontal luminance and more excellent in light-emitting efficiency than the organic EL cell obtained in any one of Comparative Examples 3-1 to 3-4.

COMPARATIVE EXAMPLE 3-5

An organic EL cell was produced in the same manner as in Example 3-1 except that neither light-diffusing layer nor reflection type polarizing element were formed. That is, the organic EL cell was equivalent to the organic EL cell as a basic configuration in Example 3-1.

COMPARATIVE EXAMPLE 3-6

An organic EL cell was produced in the same manner as in Example 3-1 except that the light-diffusing layer was formed but the reflection type polarizing element was not formed.

COMPARATIVE EXAMPLE 3-7

An organic EL cell was produced in the same manner as in Example 3-1 except that the reflection type polarizing element was formed but the light-diffusing layer was not formed.

COMPARATIVE EXAMPLE 3-8

An organic EL cell was produced in the same manner as in Comparative Example 3-1 except that neither light-diffusing layer nor reflection type polarizing element were formed. That is, the organic EL cell was equivalent to the organic EL cell as a basic configuration in Comparative Example 3-1.

COMPARATIVE EXAMPLE 3-9

An organic EL cell was produced in the same manner as in Compatative Example 3-1 except that the light-diffusing layer was formed but the reflection type polarizing element was not formed.

COMPARATIVE EXAMPLE 3-10

An organic EL cell was produced in the same manner as in Comparative Example 3-1 except that the reflection type polarizing element was formed but the light-diffusing layer was not formed.

The organic EL cell obtained in each of Comparative Examples 3-5 to 3-7 and Comparative Examples 3-8 to 3-10 was subjected to a performance test in the same manner as described above on the assumption that the cell was used as a backlight unit for a liquid crystal display device. Results of the test, in addition to the result in Example 3-1 corresponding to Comparative Examples 3-5 to 3-7 and the result in Comparative Example 3-1 corresponding to Comparative Examples 3-8 to 3-10, were collected into Table 3-2.

higher in light-emitting efficiency. In comparison between organic EL cells obtained in Comparative Examples 3-6 and 3-9 in each of which only the light-diffusing layer is formed, this tendency is however reversed so that the organic EL cell obtained in Comparative Example 3-6 satisfying the expressions (1) and (2) is higher in light-emitting efficiency.

This is because the configuration of the organic EL cell is decided so that guided light beams ordinarily unable to be extracted interfere with each other constructively as the effect of the invention. That is, the formation of the light-diffusing layer permits the guided light to be extracted. As a result, light-emitting efficiency becomes high. In Example 3-1 in which the reflection type polarizing element is further formed on the organic EL cell which is obtained in Comparative Example 3-6 so that light-emitting efficiency is improved in this manner, light-emitting efficiency is improved more greatly compared with Comparative Example 3-6.

The organic EL cells obtained in Comparative Examples 3-7 and 3-10 in each of which only the reflection type polarizing element is formed exhibit light-emitting efficiency improved by about 1.6 times due to the function of the reflection type polarizing element compared with the organic EL cells obtained in Comparative Examples 3-5 and 3-8, respectively. The light-emitting efficiency of the organic EL cells obtained in Comparative Examples 3-7 and 3-10 is however still low compared with that of the organic EL cell obtained in Example 3-1.

It is confirmed from the test results that the organic EL cell according to the invention is excellent as a polarizing-type planar light source for a liquid crystal display device.

EXAMPLE 3-3

An optically compensating layer was further stuck onto a surface of the reflection type polarizing element through an acrylic transparent tackiness agent to produce an organic EL

TABLE 3-2

|  | Thickness of Alq layer (nm) | Current density (ma/cm$^2$) | Presence of light-diffusing layer | Presence of reflection type polarizing element | Frontal luminance (cd/m$^2$) | Light-emitting efficiency (cd/A) |
|---|---|---|---|---|---|---|
| Example 3-1 | 140 | 10.5 | Yes | Yes | 323 | 3.08 |
| Comparative Example 3-5 | 140 | 10.5 | No | No | 68 | 0.65 |
| Comparative Example 3-6 | 140 | 10.5 | Yes | No | 215 | 2.05 |
| Comparative Example 3-7 | 140 | 10.5 | No | Yes | 113 | 1.08 |
| Comparative Example 3-1 | 65 | 10.5 | Yes | Yes | 235 | 2.24 |
| Comparative Example 3-8 | 65 | 10.5 | No | No | 142 | 1.36 |
| Comparative Example 3-9 | 65 | 10.5 | Yes | No | 168 | 1.60 |
| Comparative Example 3-10 | 65 | 10.5 | No | Yes | 231 | 2.20 |

From the results shown in Table 3-2, in comparison between general organic EL cells obtained in Comparative Examples 3-5 and 3-8 in each of which neither light-diffusing layer nor reflection type polarizing element are formed, the organic EL cell obtained in Comparative Example 3-8 not satisfying the expressions (1) and (2) is cell. The organic EL cell was subjected to a performance test in the same manner as described above on the assumption that the cell was used as a backlight unit for a liquid crystal display device. Incidentally, luminance was measured at intervals of 10 degrees in an angle range of from 0 degrees to 80 degrees viewed from the frontal direction in the condition that a voltage was applied to the cell so that a current of 10.5 mA flew in the cell. Results of the measurement, in addition to the test results of the organic EL cell obtained in Example 3-1, were shown in FIG. 11.

Figure 11:
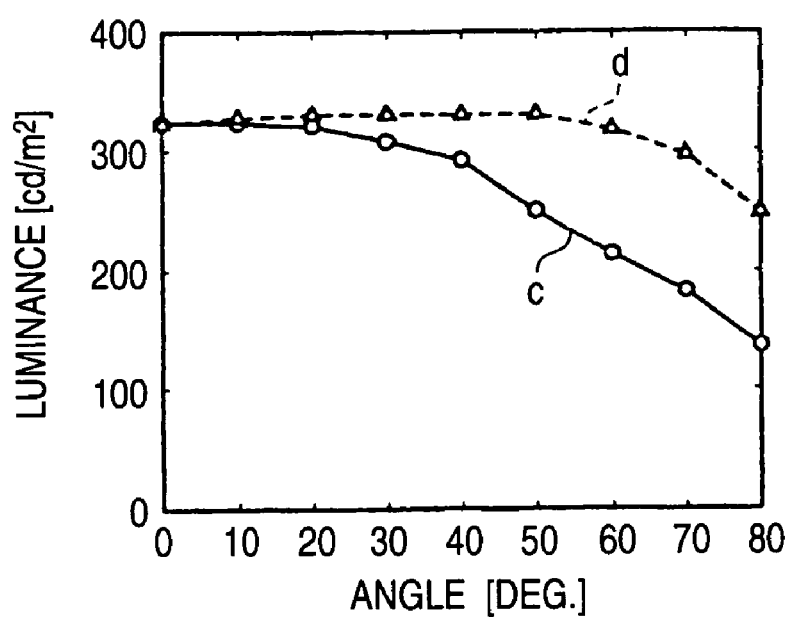
FIG. 11 is a characteristic graph showing luminance of the organic electroluminescence cell obtained in each of Examples 3-1 and 3-3.
Figure 12:
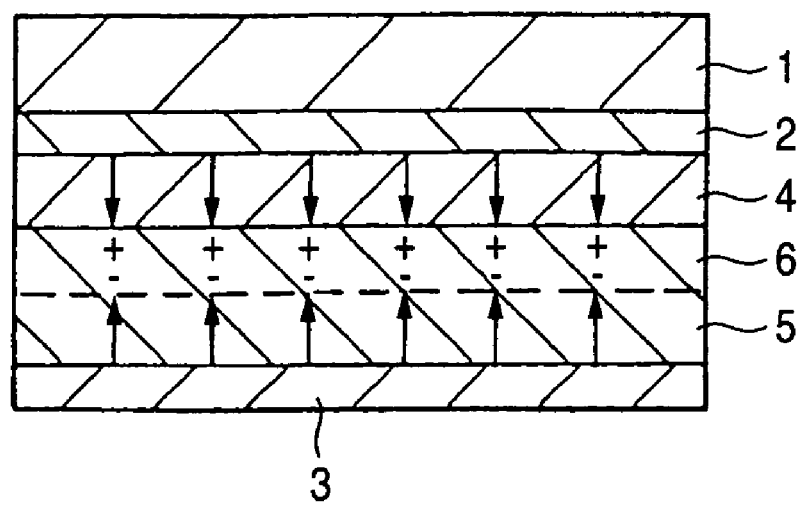
FIG. 12 is an explanatory view showing a light-emitting region of the organic electroluminescence cell.
Figure 13:
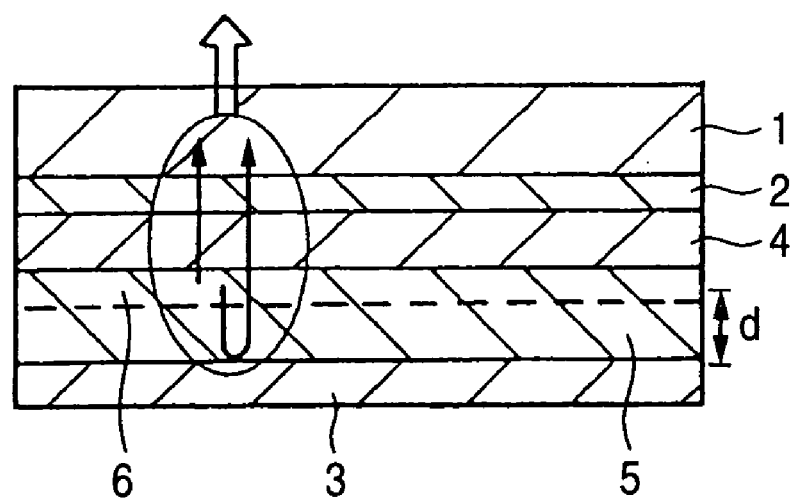
FIG. 13 is an explanatory view showing luminance of the organic electroluminescence cell.

In FIG. 11, the curve c shows Example 3-1, and the curve d shows Example 3-3. The optically compensating layer used was produced by the following method.

<Production of Optically Compensating Layer>

A solution containing 25 parts by weight of a side-chain liquid crystal polymer represented by the formula (11) (which is expressed as a block for the sake of convenience, which has a weight-average molecular weight of 5000 and in which n represents molar fraction (%) of a monomer unit and is equal to 35), and 75 parts by weight of cyclohexane dissolved in the side-chain liquid crystal polymer was applied onto a 20 μm-thick plastic film using a norbornene polymer ("ZEONEX" made by Zeon Corp.) as a polymer material, by a spin coating method.

After the resulting film was then heated at 130° C. for one minute, the film was cooled rapidly to room temperature so that the liquid crystal layer was oriented homeotropically and that the homeotropically oriented liquid crystal layer was fixed while molecular alignment was retained. Thus, an optically compensating layer exhibiting a constant refractive index in a planar direction but a high refractive index in a direction of thickness was produced.

[Chemical Formula 4]

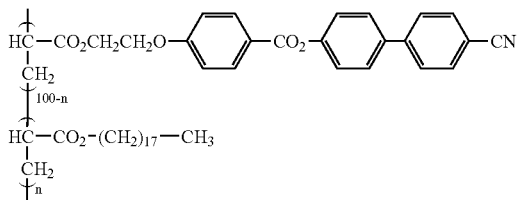

(11)

As is obvious from FIG. 11, in the organic EL cell obtained in Example 3-1, luminance shows a tendency to decrease in accordance with increase in angle. on the contrary, in the organic EL cell obtained in Example 3-3, the insertion of the optically compensating layer permits high luminance to be obtained in a wide angle range.

Incidentally, in FIG. 11, the angular distribution in each of Examples 3-1 and 3-3 does not satisfy the expression (1). This is because FIG. 11 shows measurement results after the formation of the reflection/refraction angle disturbance region. It is needless to say that the invention is provided for deciding the basic configuration of the organic EL cell to satisfy the expression (1) in the condition that the reflection/refraction angle disturbance region has not been formed yet.

EXAMPLE 3-4

An organic EL cell was produced in the same manner as in Example 3-1 except that the reflection type circular polarizing element composed of cholesteric liquid crystal layers was replaced by a reflection type linear polarizing element "DBEF" made by 3M Company.

The organic EL cell was subjected to a performance test on the assumption that the cell was used as a backlight unit for a liquid crystal display device. That is, an absorption type polarizer "NPF-HEG1425DU" made by Nitto Denko Corp. was placed on the polarizing element "DBEF" of the cell so that transmittance was maximized. A voltage was applied to the cell so that a current of 10.5 mA flew in the cell. In this condition, frontal luminance was measured.

As a result, luminance of 308 cd/m$^2$ was obtained. It was confirmed that the effect approximately equivalent to that obtained in Example 3-1 can be obtained in Example 3-4.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. An organic electroluminescence cell comprising:
   at least one organic layer;
   and a pair of electrodes serving as an anode and a cathode respectively;
   said organic layer including a light-emitting layer and being sandwiched between said pair of electrodes, at least one of said pair of electrodes being provided as a transparent electrode, said organic electroluminescence cell being formed to satisfy the expression $B_0 < B_\theta$ in which $B_0$ is a frontal luminance value of luminescence radiated from a light extraction surface, and $B_\theta$ is a luminance value of said luminescence at an angle of from 50° to 70°; and
   wherein, said organic electroluminescence cell further comprises a reflection/refraction angle disturbance region being provided substantially without interposition of any air layer so that said transparent electrode is between said light-emitting layer and said reflection/refraction angle disturbance region, and so that the angle of reflection/refraction of said luminescence is disturbed while said luminescence is output from said light-emitting layer through said transparent electrode
   wherein, one of said anode and said cathode is a transparent electrode and the other is a reflective electrode; and said organic electroluminescence cell satisfies the expression $(0.3/n)\lambda < d < (0.5/n)\lambda$ in which d (nm) is a distance between an approximate center portion of a hole-electron recombination light-emitting region and said reflective electrode, λ (nm) is a peak wavelength of a fluorescence spectrum of a material used in said light-emitting layer, and n is a refractive index of said organic layer between said light-emitting layer and said reflective electrode.

2. An organic electroluminescence cell according to claim 1, wherein said reflection/refraction angle disturbance region is constituted by a light-diffusing site which contains a transparent material, and a transparent or opaque material different in refractive index from said transparent material and dispersed/distributed in said transparent material.

3. An organic electroluminescence cell according to claim 2, further comprising a reflection type polarizing element provided on a light emission side viewed from said reflection/refraction angle disturbance region.

4. An organic electroluminescence cell according to claim 3, wherein said reflection type polarizing element is a reflection type circular polarizing element made of a cholesteric liquid crystal layer.

5. An organic electroluminescence cell according to claim 3, wherein said reflection type polarizing element is a reflection type linear polarizing element made of a multilayer laminate of at least two materials different in refractive index.

6. An organic electroluminescence cell according to claim 3, further comprising an optically compensating layer which has no anisotropy in in-plane refractive index and in which a refractive index in a direction of thickness is higher than said in-plane refractive index.

7. An organic electroluminescence cell according to claim 1, wherein said reflection/refraction angle disturbance region is constituted by a lens structure.

8. An organic electroluminescence cell according to claim 1, wherein said reflection/refraction angle disturbance region is constituted by a protruded and grooved face.

9. A planar light source having an organic electroluminescence cell defined in any one of claims 1, 2, 7, and 8.

10. A display device having a planar light source defined in claim 9.

11. An organic electroluminescence cell according to claim 1, wherein said reflection/refraction angle disturbance region is constituted by a polarizing/scattering site which contains a light-transmissive resin, and micro domains different in birefringence characteristic from said light-transmissive resin and dispersed/distributed in said light-transmissive resin.

12. An organic electroluminescence cell according to claim 11, wherein said micro domains in said polarizing/scattering site are made of one member selected from the group consisting of a liquid crystal material, a vitrified material with a liquid crystal phase supercooled and solidified, and a material with a liquid crystal phase of polymerizable liquid crystal crosslinked and fixed by an energy beam.

13. An organic electroluminescence cell according to claim 11, wherein said polarizing/scattering site contains a light-transmissive resin, and micro domains which are made of a liquid crystal polymer having a glass transition temperature of not lower than 50° C. to exhibit a nematic liquid crystal phase at a lower temperature than the glass transition temperature of said light-transmissive resin and which are dispersed in said light-transmissive resin.

14. An organic electroluminescence cell according to claim 11, wherein: said polarizing/scattering site exhibits refractive index differences $\Delta n_1$, $\Delta n_2$ and $\Delta n_3$ between said micro domains and the other portions in directions of respective optical axes of said micro domains; and the refractive index difference $\Delta n_1$ in an axial direction ($\Delta n_1$ direction) as the highest one of the refractive index differences $\Delta n_1$, $\Delta n_2$ and $\Delta n_3$ is in a range of from 0.03 to 0.5 whereas each of the refractive index differences $\Delta n_2$ and $\Delta n_3$ in two axial directions ($\Delta n_2$ direction and $\Delta n_3$ direction) perpendicular to the $\Delta n_1$ direction is not larger than 0.03.

15. A polarizing-type planar light source having an organic electroluminescence cell defined in any one of claims 3, 4, 5, 6, 11, 12, 13, 14.

16. A display device having a polarizing-type planar light source defined in claim 15.

* * * * *